(12) United States Patent
Yokozuka et al.

(10) Patent No.: US 7,554,039 B2
(45) Date of Patent: Jun. 30, 2009

(54) ELECTRONIC DEVICE

(75) Inventors: Takehide Yokozuka, Yokohama (JP);
Masahide Harada, Yokohama (JP);
Shiro Yamashita, Yokohama (JP);
Kaoru Uchiyama, Hitachinaka (JP);
Shuji Eguchi, Hitachinaka (JP);
Masahiko Asano, Hitachinaka (JP); Koji Sato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 199 days.

(21) Appl. No.: 10/535,857

(22) PCT Filed: Jun. 20, 2003

(86) PCT No.: PCT/JP03/07862

§ 371 (c)(1),
(2), (4) Date: Apr. 10, 2006

(87) PCT Pub. No.: WO2004/047168

PCT Pub. Date: Jun. 3, 2004

(65) Prior Publication Data

US 2006/0234420 A1 Oct. 19, 2006

(30) Foreign Application Priority Data

Nov. 21, 2002 (JP) ............................. 2002-337365
Nov. 21, 2002 (JP) ............................. 2002-337366

(51) Int. Cl.
*H05K 1/00* (2006.01)

(52) U.S. Cl. ...................................... 174/252; 174/260

(58) Field of Classification Search ................. 174/252, 174/260
See application file for complete search history.

(56) References Cited

U.S. PATENT DOCUMENTS

| 6,097,089 | A  | * | 8/2000  | Gaku et al. ................. 257/712 |
| 6,265,772 | B1 |   | 7/2001  | Yoshida |
| 6,359,341 | B1 | * | 3/2002  | Huang et al. ................ 257/778 |
| 6,525,942 | B2 | * | 2/2003  | Huang et al. ................ 361/704 |
| 2001/0025723 | A1 |   | 10/2001 | Kondo et al. |
| 2002/0185718 | A1 |   | 12/2002 | Mikubo |
| 2002/0189853 | A1 | * | 12/2002 | Hsu .......................... 174/252 |

FOREIGN PATENT DOCUMENTS

| JP | 05-175407   | 7/1993  |
| JP | 9-102683    | 4/1997  |
| JP | 2000-12765  | 1/2000  |
| JP | 2000-228452 | 8/2000  |
| JP | 2000-315747 | 11/2000 |
| JP | 2001-110928 | 4/2001  |
| JP | 2001-177202 | 6/2001  |
| JP | 2002-270743 | 9/2002  |

* cited by examiner

*Primary Examiner*—Ishwar I. B. Patel
(74) *Attorney, Agent, or Firm*—Mattingly & Malur, PC

(57) ABSTRACT

In an electronic device having an interposer substrate as an MCM structure, heat dissipation properties are enhanced while the reliability of joint between the interposer substrate and a motherboard is maintained. In the invention, a metal core base material of great heat capacity and high thermal conductivity is used for both the interposer substrate and the motherboard. Furthermore, a part where a core metal is exposed is provided on at least one of the interposer substrate and the motherboard. A solder joint pad is directly formed on the core metal exposed part, and the interposer substrate is solder-joined to the motherboard.

9 Claims, 25 Drawing Sheets

ELECTRONIC DEVICE

TECHNICAL FIELD

The present invention relates to a module substrate and a module structure of an electronic device.

BACKGROUND ART

An electronic device provided with an electronic substrate is required to prevent defectives caused by heat from electronic components. On this account, a thermal cycle test is to be conducted before shipping. Since the temperature inside a vehicle body is greatly varied because an engine is turned on and off and ambient temperature varies, an electronic control unit for automobile use such as an ECU (Engine Control Unit) is particularly required to withstand thermal cycles (generally temperatures of −40 to 120° C. according to general rules of environmental test for automobile electronic devices JASOD001) in a wide temperature range. Recently, there is a tendency to arrange the ECU closer to the engine, and the upper limit of the temperature range tends to be more increased. When the device undergoes such thermal cycles, it is likely that the performance of electronic components in the ECU is unstable, or connection defectives are generated between a mounting board of an electronic component and the electronic component. More specifically, the electronic device is required for high heat dissipation properties, and the electronic device for automobile use such as the ECU is particularly required for more excellent heat dissipation properties than those of general electronic components.

On the other hand, an MCM (Multi Chip Module) structure is a structure that multiple LSIs are mounted on an interposer substrate (intermediate substrate) and the interposer substrate is mounted on an electronic substrate by solder bumps and the like. Since such the MCM structure (here, it is simply called the MCM structure including the structure having an interposer with no multiple LSIs) is the structure that it is difficult to release the heat generated from the LSI to the electronic substrate, it is important how efficiently heat is dissipated when the heat of the LSI is great. When the problem of this heat dissipation is solved, an electronic control unit for automobile use of the MCM structure can be implemented. For the heat dissipation structure, there is the structure that a heat sink is disposed on the top surface of the LSI, for example, but it is sometimes difficult to implement it when the thickness direction is limited because of the product structure. Furthermore, a problem sometimes arises because of reliability.

A traditional structure is described in JP-A-5-175407 and JP-A-2000-228452, which enhances the heat dissipation property of a semiconductor module using a metal core base material as an interposer substrate.

JP-A-5-175407 describes a metal core base material used for an interposer substrate. A resin layer on one side (the front surface) of the metal core base material is partially removed, and a semiconductor chip is die-bonded to an area where a core metal is exposed thus formed. Moreover, a resin layer on the other side (the back side) of the metal core base material is partially removed, and an area where a core metal is exposed thus formed is cooled by air.

On the other hand, JP-A-2000-228452 describes a metal core base material in which a semiconductor chip is mounted on one side (the front surface) in the same mounting structure as that of JP-A-5-175407. A thermal via is formed between a conductor circuit to which a solder ball for connecting another substrate on the other side (the back side) of the metal core base material and a metal core. The via hole is applied with metal plating, for example, or filled with resin and metal such as solder. It is described that such a thermal via is provided to allow efficiently dissipating the heat of electronic components. In the meantime, the structure described in JP-A-5-175407 is expected to effect heat dissipation from the part of the exposed metal core on the back side of the metal core base material to ambient air, but the product structure having an underfill and gel, for example, where an air flow hardly occurs is rarely expected to effect this advantage. Furthermore, since the difference in thermal expansion coefficients between the interposer substrate and the motherboard is not considered, it is likely to generate connection defectives caused by thermal cycles.

Moreover, in the structure described in JP-A-2000-228452, the thermal via is formed from the core metal to the conductor circuit, but it is costly to form the thermal via. Besides, the thermal via that can be formed in a printed wiring board generally has poor heat dissipation properties because of a hollow, thin plate by copper plating.

DISCLOSURE OF THE INVENTION

An object of the invention is to provide an electronic device excellent in heat dissipation properties at low cost as the reliability of joint is maintained between an interposer substrate and a motherboard. The invention discloses various means to achieve the object. Hereinafter, typical means will be described.

First, a metal core base material of great heat capacity and high thermal conductivity is adopted for both an interposer substrate and a motherboard mounted on an electronic device. Alternatively, a metal core base material of great heat capacity and high thermal conductivity is adopted for an interposer substrate, and a metal base material of great heat capacity and high thermal conductivity is adopted for a motherboard. Therefore, an electronic device according to the invention is excellent in heat dissipation properties.

Furthermore, a metal core base material or metal base material having a thermal expansion coefficient close to that of the metal core base material used for the interposer substrate is used for the motherboard. In the traditional MCM, the reliability of solder for joining the interposer substrate to the motherboard is sometimes a problem. This is mainly caused by the difference in thermal expansion coefficients between the interposer substrate and the motherboard. In the invention, as described above, the substrates having close thermal expansion coefficients are used for the interposer substrate and the motherboard. Thus, the reliability of solder for joining the interposer substrate to the motherboard is enhanced, and consequently the heat resistance of the electronic device is improved.

Moreover, at least one metal (base material) of the interposer substrate and the motherboard is exposed, and a solder joint pad is directly formed on the exposed part to solder join the interposer substrate to the motherboard. According to this structure, since the interposer substrate is solder-joined to the motherboard not through an insulating layer of low thermal conductivity formed on the metal (base material) of the motherboard or the interposer substrate, the heat dissipation property can be enhanced. Here, the exposed part of the metal (base material) can be formed at the same time when a via hole is formed, and a pad on the metal (base material) can be formed at the same time when other pads for electrical connection are formed. Therefore, cost is not increased.

Besides, when the solder joint pad for heat dissipation on the core metal or base material exposed by partially removing a resin layer is formed smaller than the solder joint pad for electrical connection on the resin layer by the size according to the removed volume of the resin layer, both of the solder joint pad for heat dissipation and the solder joint pad for electrical connection can be connected by solder of the same volume. Therefore, solder balls of the same size can be fed to both the solder joint pad for heat dissipation and the solder joint pad for electric connection, and the pads can be efficiently BGA-connected collectively under the same reflow condition.

BEST MODE FOR CARRYING OUT THE INVENTION

Hereinafter, embodiments according to the invention will be described with reference to the drawings. Here, an ECU is taken as an example of an electronic device according to the invention.

Figure 21:
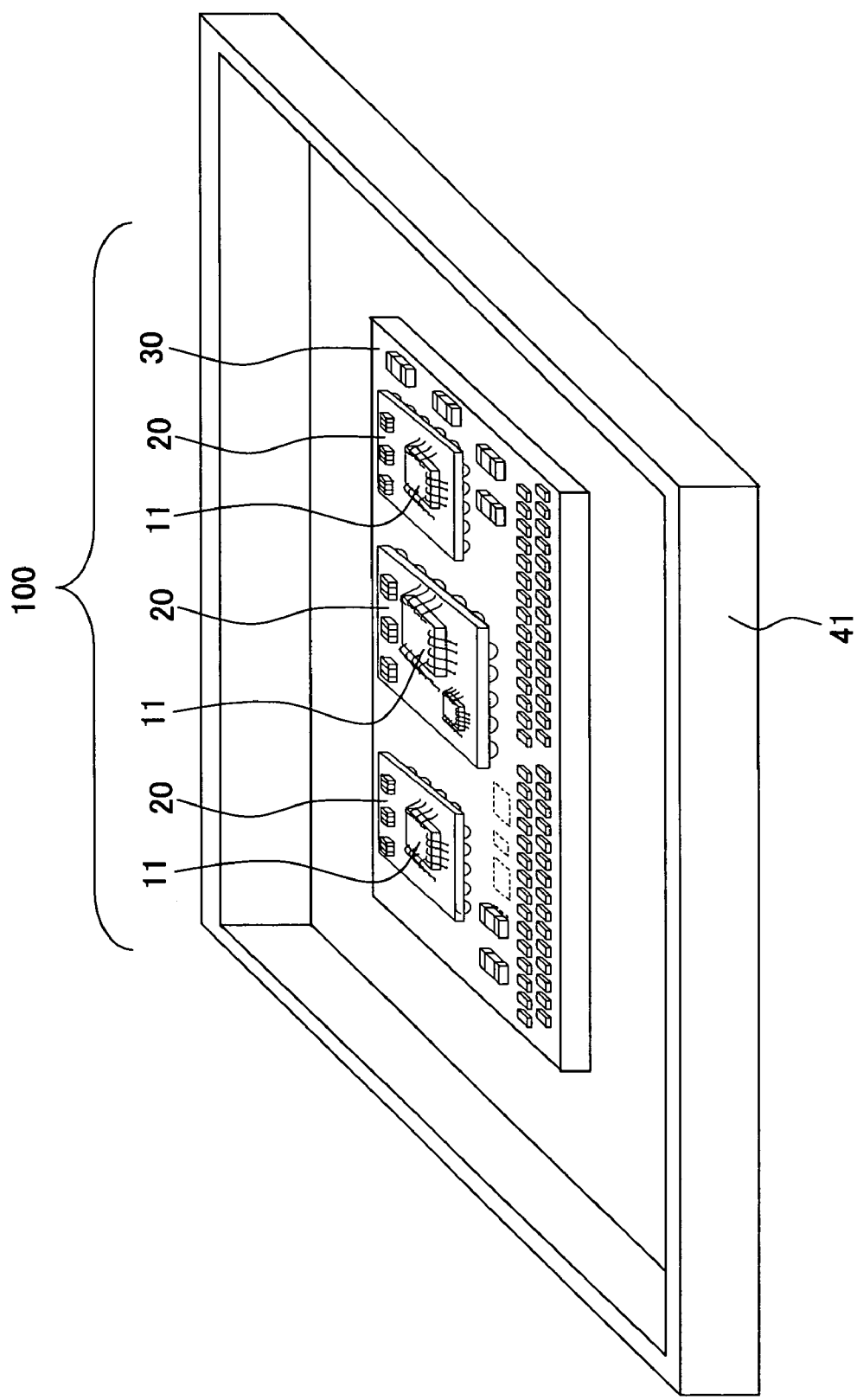
FIG. 21 is a perspective view illustrating the state that an upper case of an ECU according to the invention is opened.

FIG. 21 is a perspective view illustrating the state that an upper case of an ECU as an electronic device of the embodiment is opened.

The electronic device is configured of a lower case 41 having a connector (not shown) which connects to an external terminal molded on a sidewall thereof, a module 100 which is fixed to the lower case 41 and electrically connected to a terminal of the connector, and the upper case (not shown) which is fit into the lower case 41 and seals the module 100.

The case is generally formed of light aluminum. However, the heat dissipation function of the case does not depend on materials, and thus materials for the case can be selected randomly.

The module 100 has an interposer substrate 20 on which an LSI chip 11 as an electronic component is mounted, and a motherboard 30 on which the interposer substrate 25 is mounted. The substrates 20 and 30 are joined to each other with solder. Three LSI chips 11 of high heat dissipation are mounted on separate interposer substrates along with other electronic components. Among three LSI chips 11, one is a power source IC chip and two are driver IC chips.

Hereinafter, various forms of modules used for the ECU will be described by using the drawings. Each form described below can be applied to both cases where LSI chips mounted on the interposer substrate are power source IC chips and driver IC chips. Furthermore, a module on which a single LSI chip is mounted is exemplified below, but the LSI chip mounted on the interposer substrate is not necessarily a single chip. For example, it is acceptable that both the power source IC chip and the driver IC chip are mounted on the interposer substrate.

Figure 1:
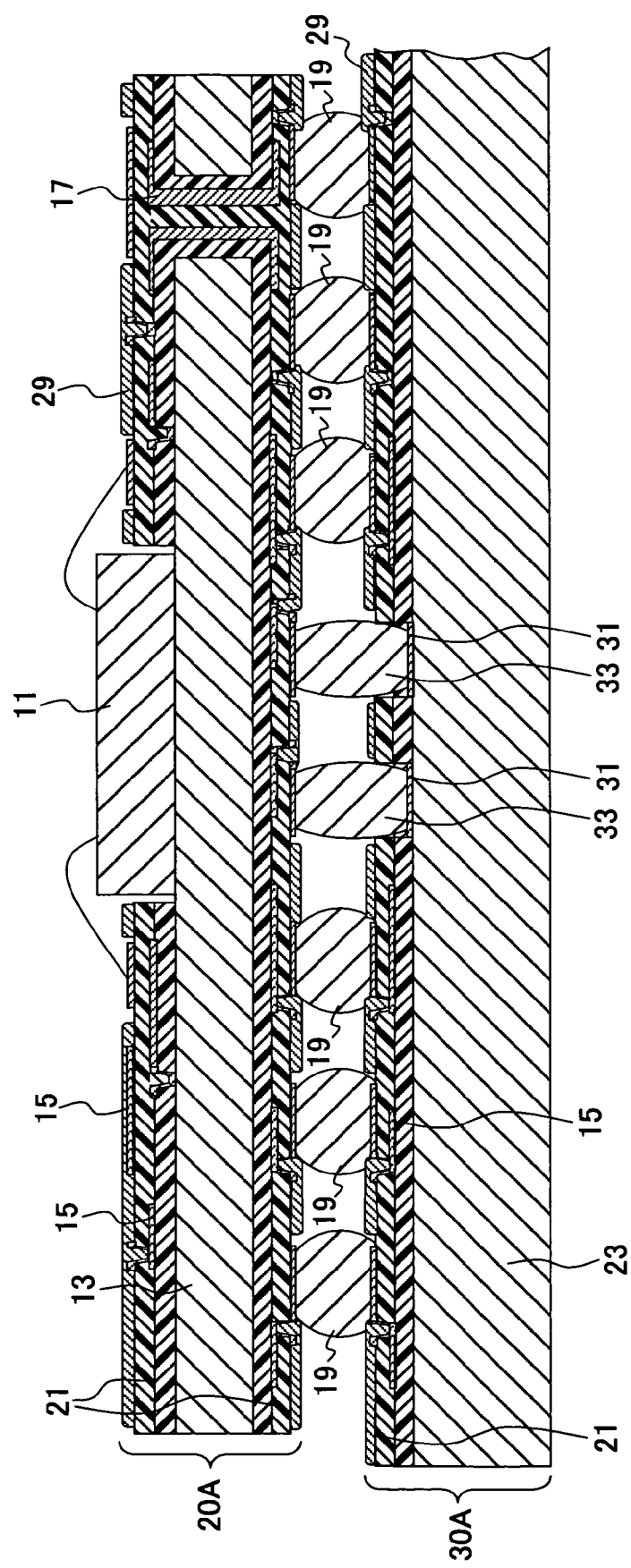
FIG. 1 is a cross-sectional view illustrating a mounting structure according to the invention.

A module shown in FIG. 1 has an LSI chip 11, solder parts 19 formed by melting solder balls, a metal core base material 20A used as the interposer substrate 20, a metal base material 30A used as the motherboard 30, and a solder resist 29.

The metal core base material 20A is a substrate that has a metal plate (core metal 13) as a core and has an insulating layer 21 formed of a resin and a wiring layer 15 on both sides of the core metal 13. In addition, 17 denotes a through hole.

The metal base material 30A is a substrate that has a metal plate (metal base 23) as a base to form an insulating layer 21 of a resin on one side thereof and a wiring layer 15 is formed on the insulating layer 21.

An insulating resin is partially removed from the insulating layer 21 on one side (the front surface) of the metal core base material 20A, and the LSI chip 11 of face-up type is die-bonded on the core metal in that area without intervening the insulating layer. The LSI chip 11 is wire-bonded to the wiring layer 15 on the surface mounting the LSI chip. The insulating resin is removed by laser at the same time when a via is formed after the circuit on the front layer is formed. There are several types of laser such as carbon dioxide laser, YAG laser and the like, and any types are acceptable. However, processing costs are inexpensive when carbon dioxide laser is used. Moreover, it is fine to mechanically remove the resin.

Besides, solder joint pads which electrically connect to the motherboard are formed on the wiring layer on the other side (the back side) of the metal core base material 20A. Among these solder joint pads, those formed in the area on the opposite side of the area for mounting the LSI chip 11 are used for any one of the purposes for heat dissipation, power source, and ground.

On the metal base 23 of the metal base material 30A, two layers of the insulating layers 21 and two layers of the wiring layers 15 are laminated alternately. Apart of the wiring layer is a solder joint pad and connected to the interposer substrate 20A with solder. A solder joint pad 31 for heat dissipation is formed in which the insulating resin is partially removed from the insulating layer on one side (the front surface) on the metal base material 30A to expose the base metal 23 and Ni plating and Au plating are applied onto that area. Furthermore, the other side (the back side) of the metal base material 30A is attached to the case 41 with an adhesive.

The metal core interposer substrate is fabricated by the following process.

First, a copper plate of 0.2 mmt×300 mm×500 mm is prepared as a metal 13 for the core. The copper plate has the size that allows multiple substrates to be cut out for use at a later stage of course, it is acceptable that the copper plate has the size easy to handle for fabricating substrates. For the types of metal, aluminum, Fe—Ni alloy and the like are fine, but copper having excellent thermal conductivity is preferable.

A hole for forming a through hole (0.8 mmϕ) and slits along the outer shape of substrate pieces for easily cutting out in the substrate size at a later stage were formed by etching. In addition, a solution containing ferric chloride is used as an etching solution.

Subsequently, a prepreg 21 (epoxy resin containing glass cloth; a thickness of 0.1 mmt) and a copper foil 15 (a thickness of 0.012 mmt) are laminated on the front and back sides of the metal 13 as the insulating layer and the wiring layer of inner layer, and attached to each other by press. Furthermore, it is acceptable to use a copper foil RCF (Resin Coated Copper Foil) with resin instead of the prepreg and the copper foil.

Then, the copper foil in the part unnecessary for wiring was removed by etching.

When the core metal needs to be electrically connected to the inner layer wiring, a counterbore having a diameter of 0.15 mmϕ for forming an inner layer via was formed by laser so as to expose the core metal. Any laser such as carbon dioxide laser and YAG laser are acceptable. However, carbon dioxide laser is preferable because processing can be done at low cost.

At the same time, a through hole for the through hole 17 was formed which electrically connects the inner layers of the front and back sides of the metal core base material to each other by drilling. The through hole can also be processed by laser, but drilling is suitable when the prepreg is used because of glass cloth.

Subsequently, copper plating of a thickness of about 0.015 mm was applied for the inner layer through hole, the inner layer via, and the inner layer wiring.

The process of forming the insulating layer and the wiring layer of inner layer was again repeated to form the front layer circuit. At this time, together with forming the via, the resin in the LSI chip mounting area is removed.

For wiring and the via hole, copper plating of the same thickness described above was applied, and electroless nickel plating (a thickness of about 0.005 mm) and electroless gold plating (a thickness of about 0.001 mm) were applied for wiring corrosion proof and solder joint.

Moreover, the solder resist 29 was formed by pattern while the portion required to be exposed for mounting the electronic component was left. Here, the example was taken that the wiring layers of the front and back sides of the metal core base material 20A were two layers for each side. However, since the invention does not depend on the number of the wiring layers, the wiring layers of the front and back sides of the metal core base material 20A are not necessarily two layers. In order to increase the number of the wiring layers of the front and back sides of the metal core base material 20A, it is fine to repeat the process described before. This is similarly applied below.

Ag paste is applied to the desired portion for mounting components on the front surface of the metal core interposer substrate 20A fabricated as described above, and the electronic components are mounted. Moreover, Ag paste is cured under a suitable curing condition (for example, a temperature of 150° C. for one hour), and the electronic components are attached to the metal core base material 20A. Here, when this attachment is done by solder, the heat dissipation property can be more enhanced.

Then, an electrode of the LSI 11 of high heat dissipation is wire-bonded to an electrode of the metal core interposer substrate 20A. When the surface for mounting components of the interposer substrate 20A is packaged with molding by resin as required, handleability is improved.

After flux is applied, a Sn3Ag0.5Cu solder ball is mounted on the electrode on the back side of the metal core base material 20A, and the solder is reflowed at the maximum temperature of 240° C. for 20 seconds of solder fusion time. Thus, a solder bump is formed. In addition, other solders can be used. In this case, a ball is formed under reflow conditions according to the solder type.

The metal base material 30A used as the motherboard 30 is similarly formed as the metal core base material except the following point.

The metal base material 30A has the insulating layer and the wiring layer on one side of the metal, and thus a through hole penetrating through the core metal is not required. Therefore, it can be fabricated by a simpler process.

After the front layer circuit is formed, the via hole and the counterbore for forming the solder joint pad on the base metal 23 are formed in the insulating layer by carbon dioxide laser and the like. Then, electroless nickel plating and electroless gold plating are applied to the base metal 23 exposed from the bottom part of the counterbore. Thus, the solder joint pad for heat dissipation is formed. The thickness of electroless nickel plating on the base metal 23 is about 0.005 mm, and the thickness of gold plating is about 0.001 mm. When the base metal 23 is copper, the plating above is not required necessarily, but plating is applied to enhance solder joint and the reliability of joint.

A mask for solder printing having a mask thickness of 0.1 mm is used on the solder joint pad of the metal base material 30A to print solder paste by printing.

On the printed solder in paste, the solder bump of the interposer substrate is aligned and mounted. After that, the solder is again reflowed to effect solder joint.

This solder printing is not necessarily required, but when it is done, the viscosity of the printed solder can prevent misregistration of the interposer substrate during reflow.

In this structure, since the heat capacity of the motherboard is great, the heat generated by the LSI is diffused in the metal core interposer substrate as well as the heat is effectively transferred vertically (in the direction of the motherboard) through solder to diffuse the heat also in the motherboard. Most of the general printed circuit boards have a base material of resin of bad thermal conductivity. However, since the metal base material has a base of metal of excellent thermal conductivity and the insulating resin layer is thin, the efficient heat dissipation structure as described above can be obtained.

In MCM, the reliability of solder which connects the interposer substrate to the motherboard is sometimes a problem. This is caused by the difference in thermal expansion coefficients between the interposer substrate and the motherboard. However, in the embodiment, since materials having close thermal expansion coefficients which will not generate connection defectives are used for the base metal and core metal, the difference in thermal expansion coefficients between the interposer substrate and the motherboard can be decreased. Therefore, the reliability of solder joint is improved. This advantage can be expected to any embodiments below.

In order to improve the heat dissipation property, the pad 31 on the base metal of the motherboard thus formed is connected to the solder joint pad of the metal core base material 20A with a solder bump 33. Of course, for electrical connection (for signal transmission), typical pads on the insulating resin are connected to each other with the solder bump 19.

In this structure, since the heat generated by the LSI can be dissipated to the metal base of the motherboard, a more excellent heat dissipation property can be obtained. Furthermore, when the size of the solder joint pad for heat dissipation on the core metal exposed by partially removing the resin layer is formed smaller than the size of the solder joint pad for electrical connection on the resin layer by the size according to the removed volume of the resin layer, both the solder joint pad for heat dissipation and the solder joint pad for electrical connection can be connected by solder of the same volume. Thus, the solder balls of the same size are fed to both the solder joint pad for heat dissipation and the solder joint pad for electrical connection, and can be reflowed collectively at the same process step. Therefore, special process steps are not required, and thus low cost is allowed.

Figure 2:
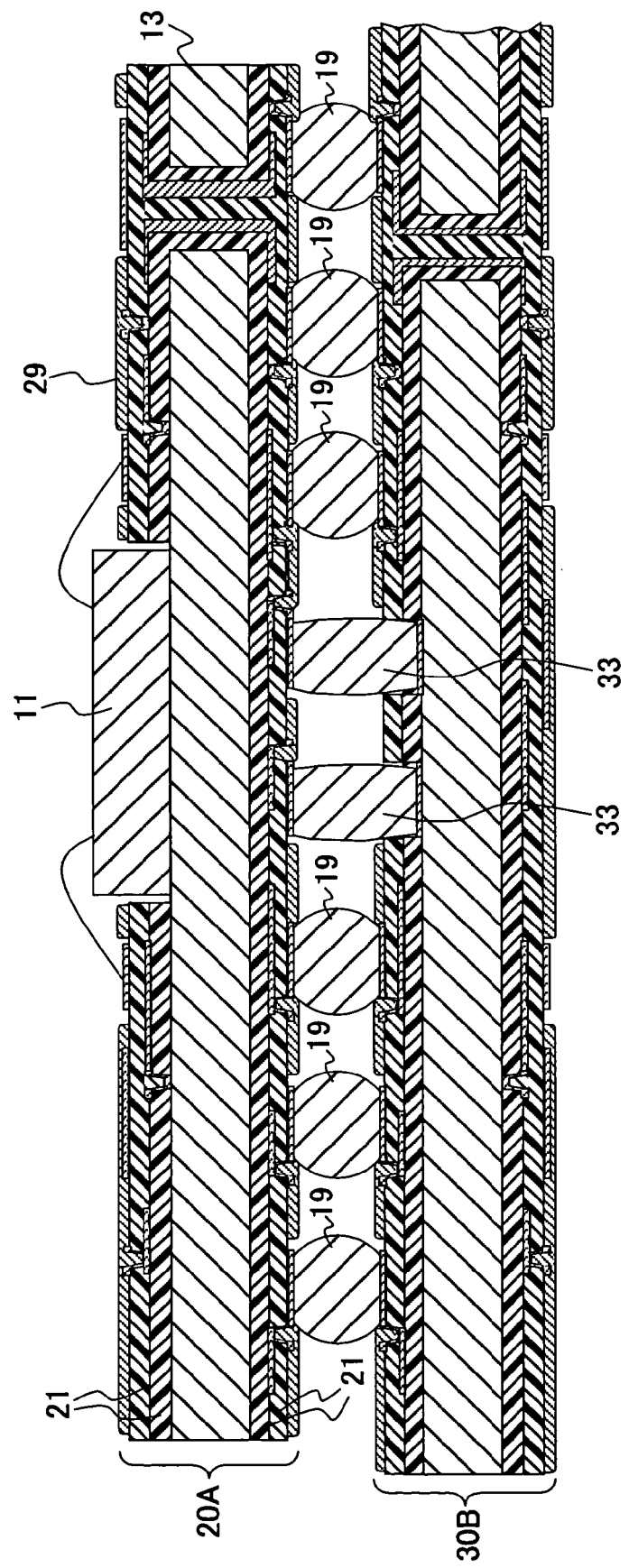
FIG. 2 is a cross-sectional view illustrating a mounting structure according to the invention.

FIG. 2 is the same as FIG. 1 except that a motherboard is a metal core base material 30B with wiring on both surfaces.

Figure 3:
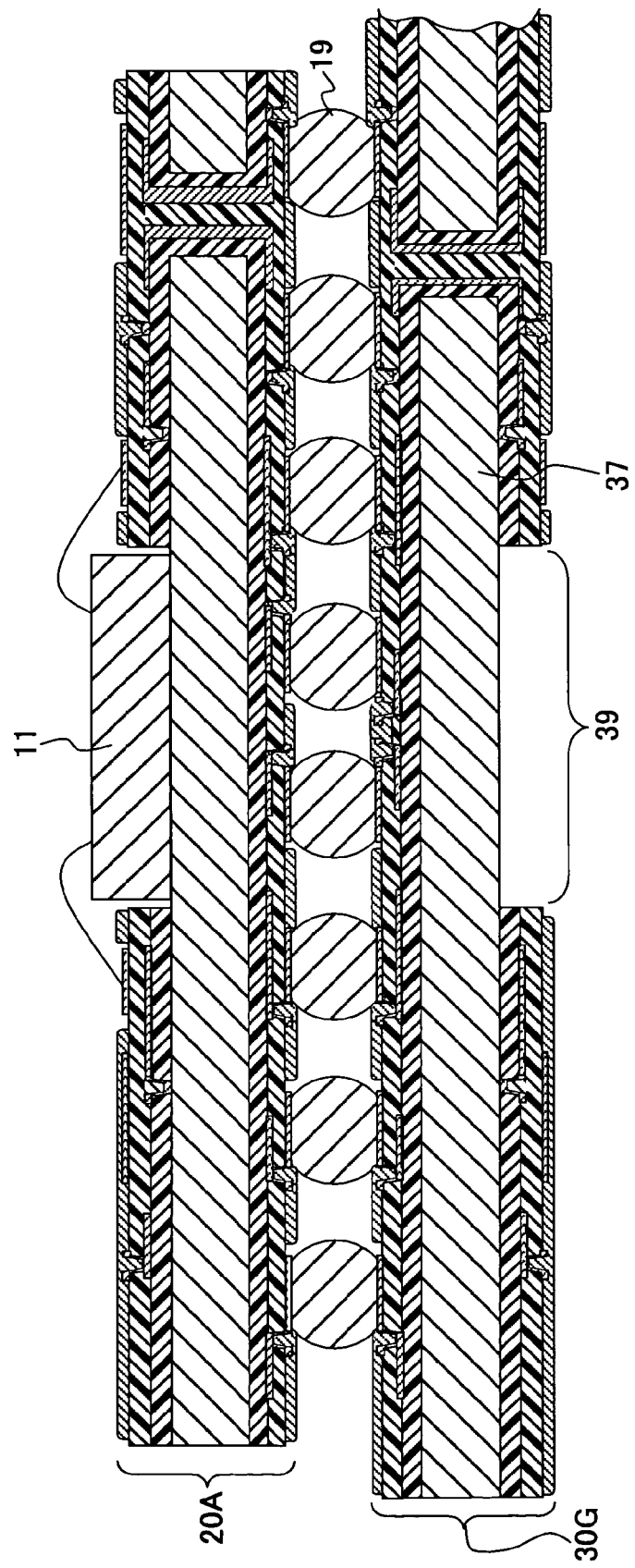
FIG. 3 is a cross-sectional view illustrating a mounting structure according to the invention.
Figure 4:
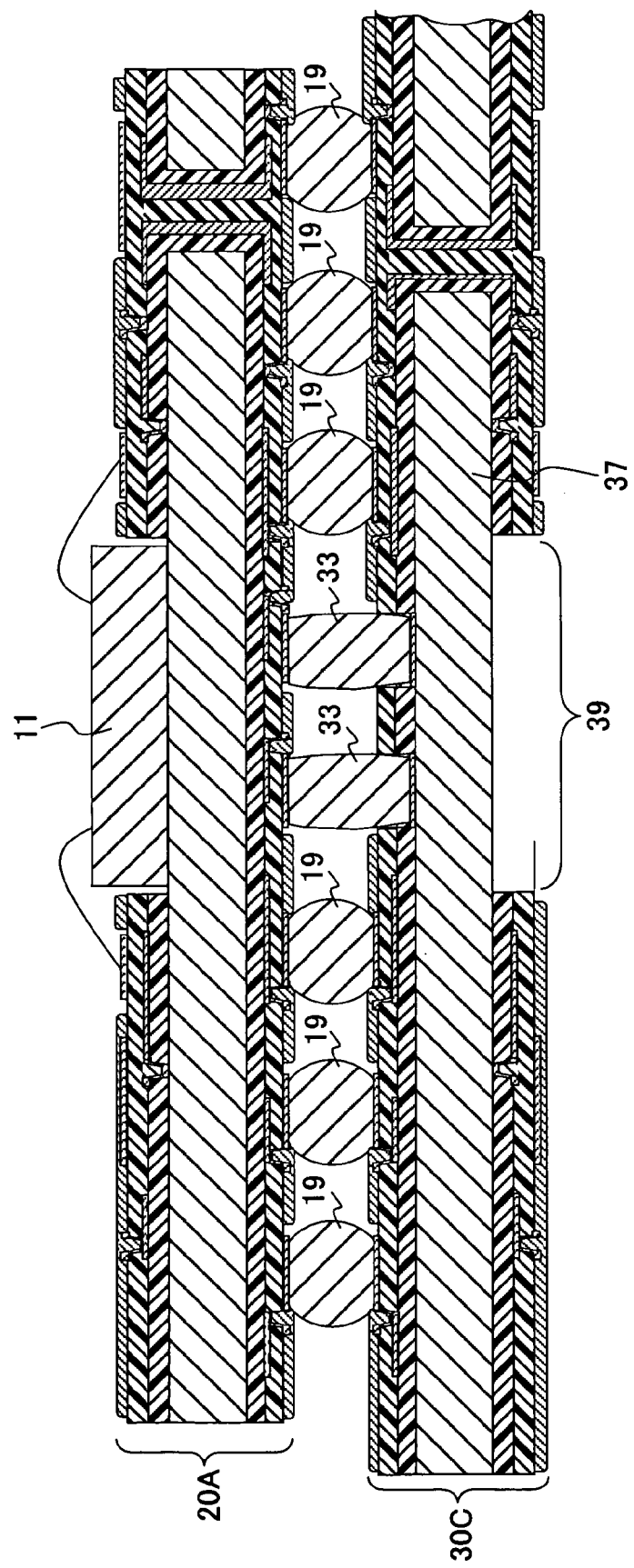
FIG. 4 is a cross-sectional view illustrating a mounting structure according to the invention.
Figure 5:
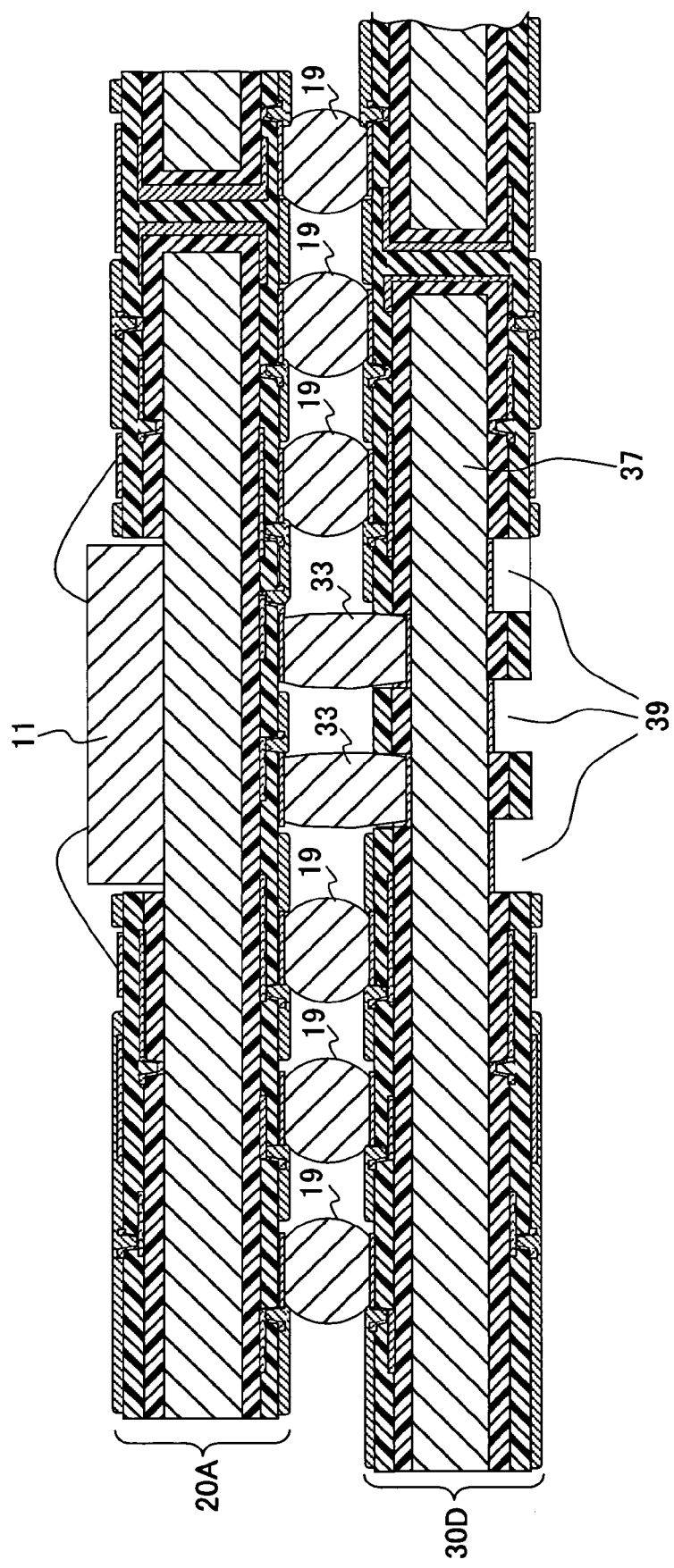
FIG. 5 is a cross-sectional view illustrating a mounting structure according to the invention.

FIGS. 3 to 5 show the structures of using metal core base materials 30G, 30C and 30D with wiring on both surfaces as the motherboard 30 in which an insulating resin of an insulating layer on the back side (the surface not mounting the interposer substrate) is partially removed so as to expose a core metal.

When the core metal is partially exposed so as not to be covered with the insulating layer in this manner, the heat dissipation property can be more enhanced.

According to the structure, the structure that an underfill and gel are filled between the interposer substrate and the motherboard, for example, can also obtain high heat dissipation properties.

Since the thermal conductivity of the core metal is great, the chip mounting counterbore is not necessarily placed close to the center of the substrate in any embodiments above. Furthermore, the pad for heat dissipation directly formed in the core metal is not necessarily placed right under the chip mounting part as well. This is similarly applied to the modules of the structure described above and to modules of structures described below.

Figure 7:
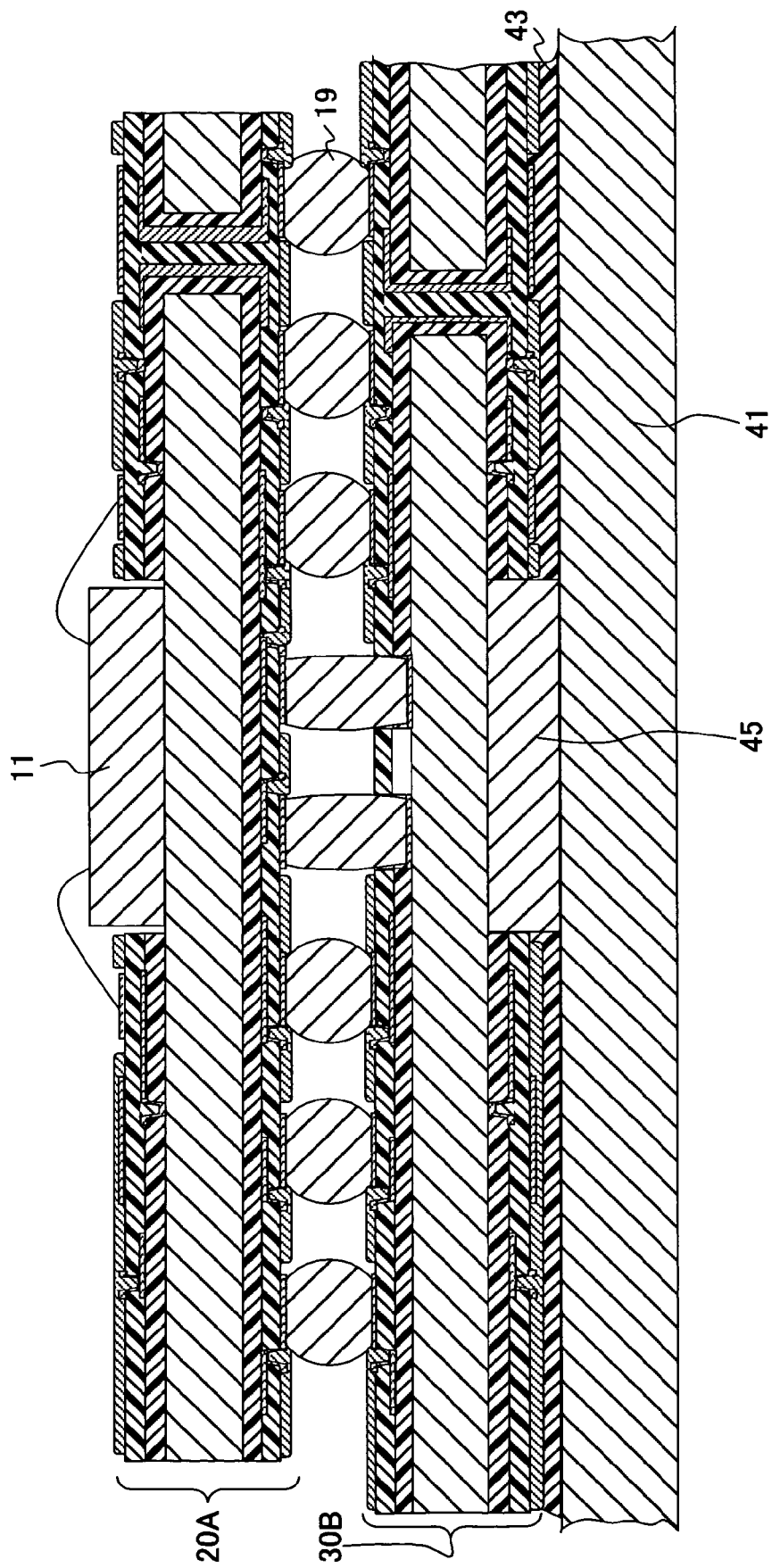
FIG. 7 is a cross-sectional view illustrating a mounting structure according to the invention.

FIG. 7 depicts the structure that a module is attached to a case 41 of metal (for example, aluminum).

As shown in FIG. 7, when a highly thermal conductive member 45 is interposed between the counterbore part on the back side of the motherboard and the case 41, the heat dissipation property can be more enhanced. This is similarly applied to the module having multiple counterbore parts on the back side of the motherboard as shown in FIG. 5. Here, the highly thermal conductive member is a member that has thermal conductivity greater than that of an adhesive attaching the motherboard to the aluminum case, and is a metal plate such as copper and aluminum, solder, high thermal conductive resin or adhesive, for example. When solder is used particularly, it is acceptable that a solder joint pad is formed on the case for connection, or solder is fed to the core metal of the motherboard and pressed to the case for connection only by contact. When solder is just contacted to the case, a pad is not necessarily formed on the case. When the metal plate is sandwiched, it is acceptable that an adhesive is applied on both sides of the metal plate for connection, or the plate is simply contacted. Connecting the motherboard to the case except the relevant parts is effected by using an adhesive 43 such as a typical adhesive and a high thermal conductive adhesive.

Figure 8:
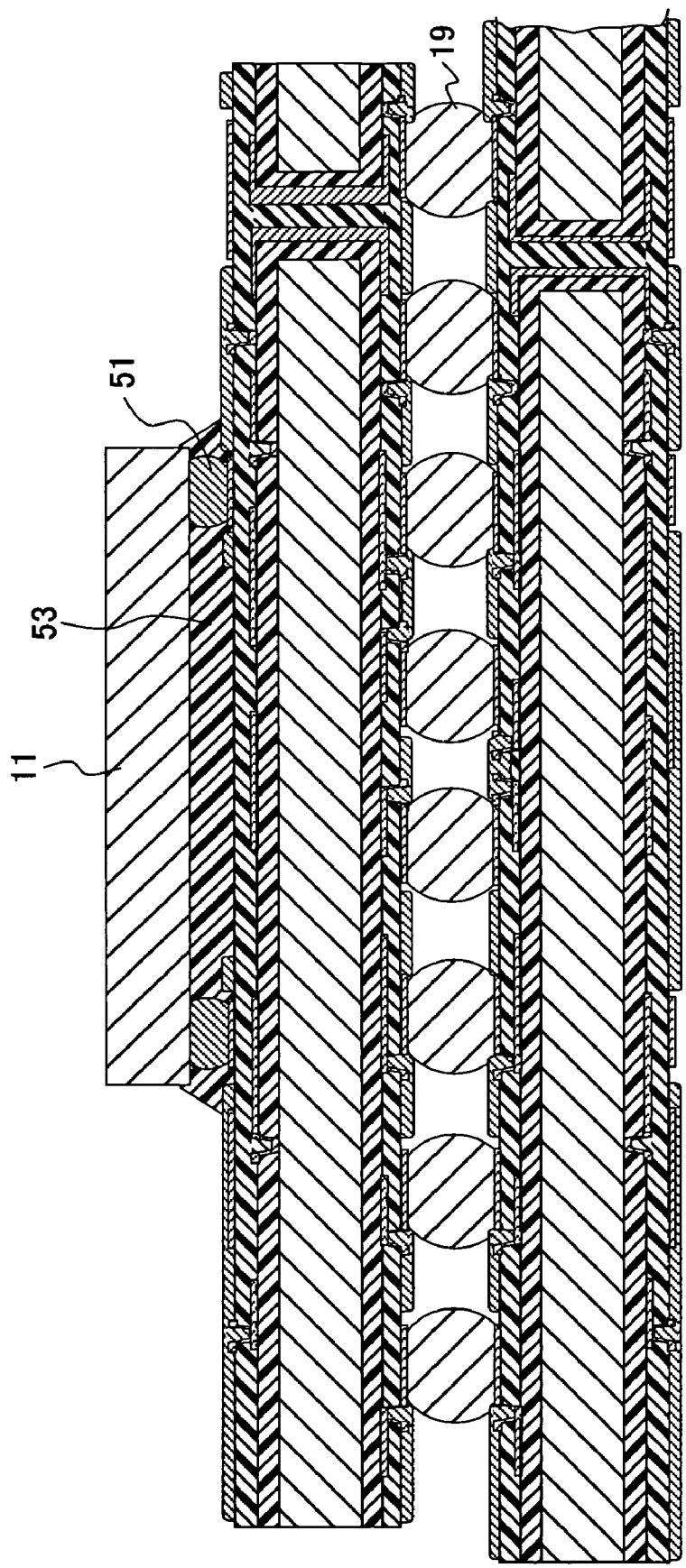
FIG. 8 is a cross-sectional view illustrating a mounting structure according to the invention.

FIG. 8 is an example that an LSI chip 11 is face-down on a metal core interposer substrate and a terminal is a bump 51 connected in flip-chip. An underfill 53 is interposed between the interposer substrate and the LSI chip 11. When the underfill 53 is used in this manner, the reliability and the heat dissipation property are enhanced.

Figure 9:
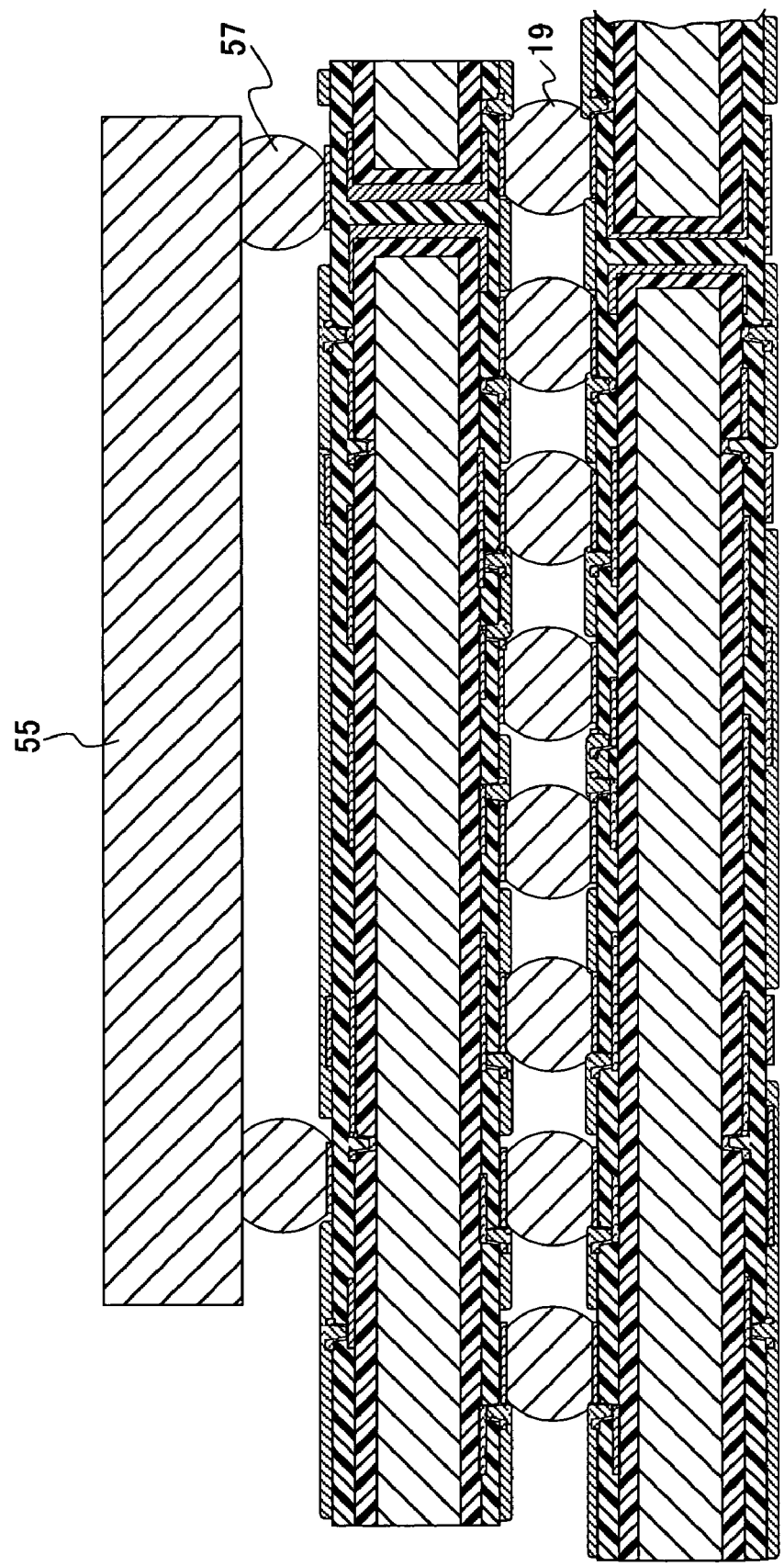
FIG. 9 is a cross-sectional view illustrating a mounting structure according to the invention.

FIG. 9 is an example of the structure that a semiconductor package 55 is connected on a metal core interposer substrate by solder bumps 57. Also in this structure, the heat dissipation property can be enhanced.

Figure 10:
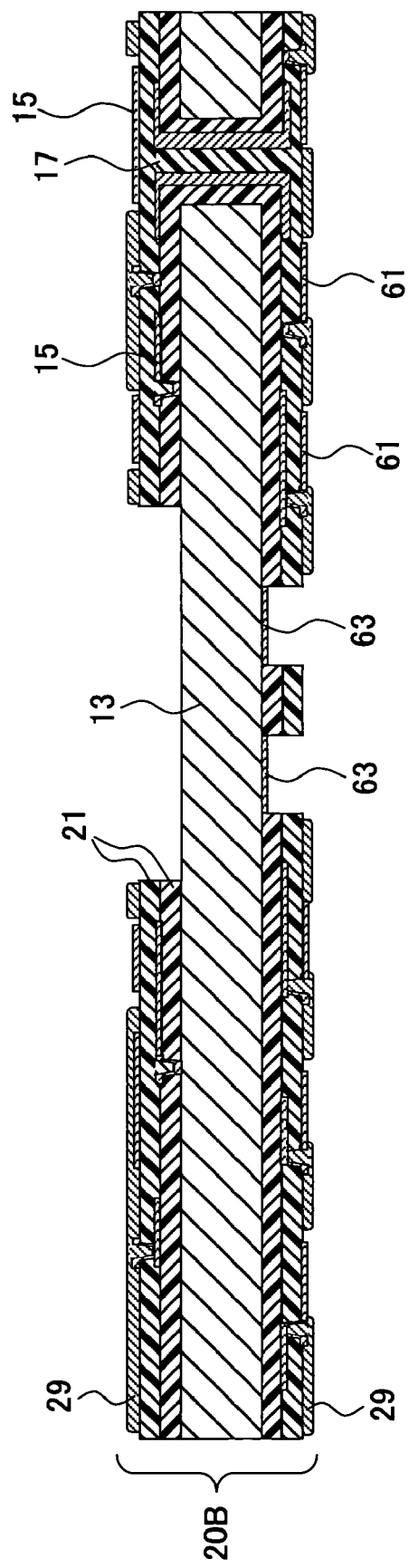
FIG. 10 is a cross-sectional view illustrating a mounting structure according to the invention.

FIG. 10 is an example of the interposer structure that obtains the MCM structure of much higher heat dissipation. An interposer substrate 20B is a metal core base having a metal as a core in which an insulating layer 21 and a wiring layer 15 are formed on both sides of a core metal 13. On one side of the substrate, a counterbore is formed in an insulating resin for mounting a high heat dissipation LSI to form a part where the core metal 13 is exposed. On the insulating resin layer on the other side of the substrate 20B, a solder joint pad 61 which electrically connects to the motherboard and a counterbore of desired size are formed. A solder joint pad 63 for heat dissipation is directly formed on the core metal 13 exposed in the bottom part of the counterbore.

Figure 11:
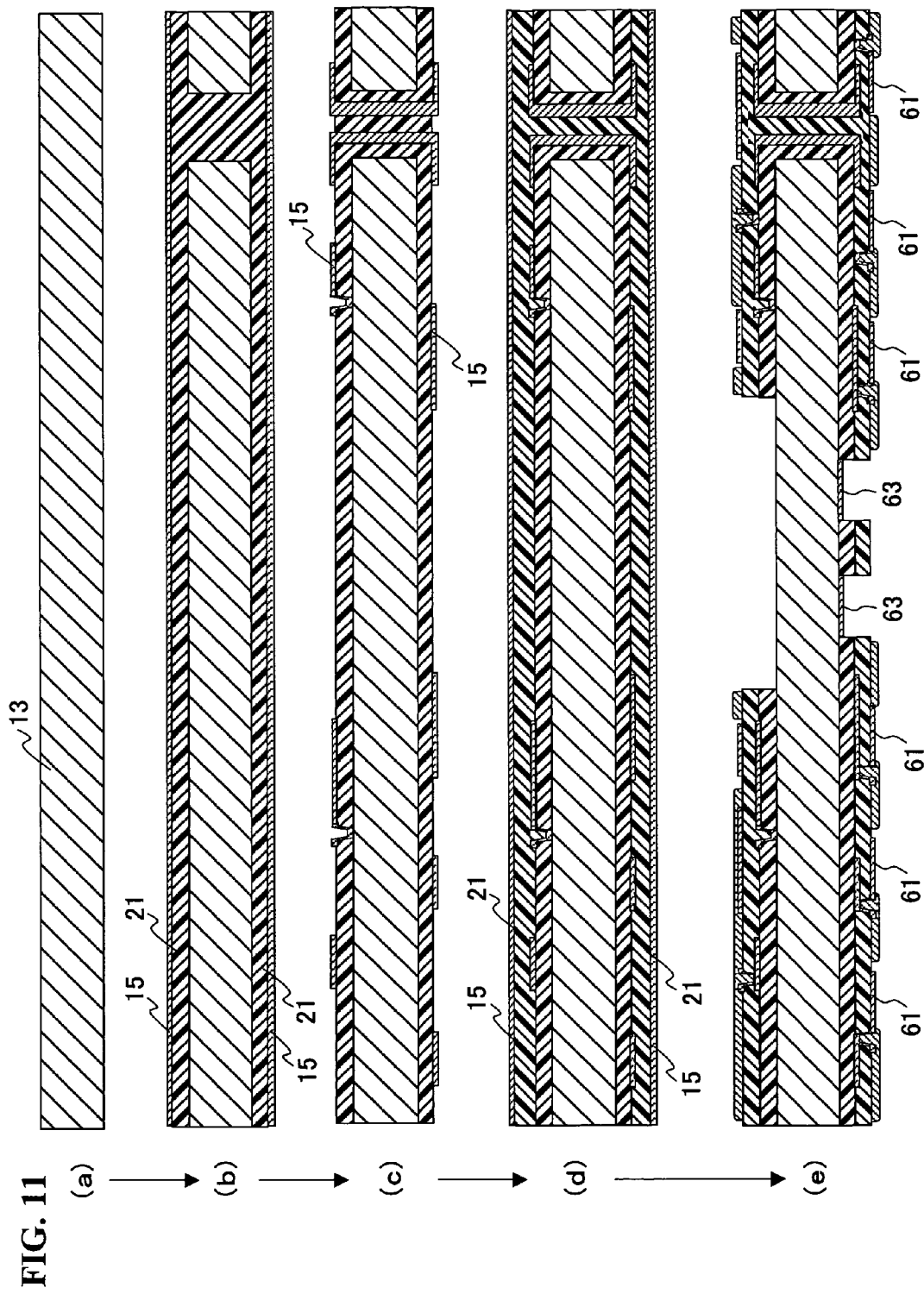
FIG. 11 is a cross-sectional view illustrating a fabrication method of an electronic substrate according to the invention.

FIG. 11 is an example of a fabrication process for obtaining the interposer substrate 20B shown in FIG. 10. First, a copper plate of 0.2 mmt×300 mm×500 mm is prepared as the metal 13 to be a core. The copper plate has the size that allows multiple substrates to be cut out for use at a later stage. Of course, it is fine that the copper plate has the size that can be easily handled for fabricating substrates. For the types of metal, aluminum, Fe—Ni alloy and the like are fine, but copper having excellent thermal conductivity is preferable. A hole (0.8 mmφ) for forming a through hole and slits along the outer shape of substrate pieces for easily cutting out in the substrate size at a later stage were formed by etching. An etching solution was ferric chloride (FIG. 11-(a)).

Subsequently, a prepreg 21 (epoxy resin containing glass cloth; a thickness of 0.1 mmt) and a copper foil 15 (a thickness of 0.012 mmt) to be the insulating resin layer and the wiring layer of inner layer are laminated on both sides of metal and attached by press. It is fine to use a copper foil RCF (Resin Coated Copper Foil) with resin instead of the prepreg and the copper foil (FIG. 11-(b)).

The silver foil in the part unnecessary for wiring was removed by etching. When the core metal needs to be electrically connected to the inner layer wiring, a counterbore having a diameter of 0.15 mmφ for forming an inner layer via is formed by laser so as to expose the core metal. Any laser such as carbon dioxide laser and YAG laser are fine, but processing can be done at low cost when carbon dioxide laser is used. At the same time, a through hole for a through hole 17 which electrically connects the inner layers of the front and back sides of the substrate to each other was formed by drilling. This through hole can also be processed by laser, but drilling is suitable when the prepreg is used because it has glass cloth. Then, copper plating having a thickness of about 0.015 mm was applied for the inner layer through hole, the inner layer via, and the inner layer wiring (FIG. 11-(c)).

The process of forming the insulating resin layer and the wiring layer of inner layer was again repeated to form the front layer circuit. At the same time when the via hole which electrically connects the front layer to the inner layer is formed, a counterbore of 5 mm square for mounting the LSI and a counter bore of 0.6 mmφ for forming the pad on the core metal were formed by carbon dioxide laser. Copper plating of the same thickness described above was applied to wiring and the via hole part, and electroless nickel plating (a thickness of about 0.005 mm) and electroless gold plating (a thickness of about 0.001 mm) were applied to wiring corrosion proof and solder joint. Therefore, a BGA solder joint pad 61 of 0.6 mmφ for electrical connection and a solder joint pad 63 of 0.6 mmφ for heat dissipation right above the core metal could be formed at the same time. The pad pitch was all 1.5 mm. For the counterbore part for heat dissipation, the insulating resin is removed. Therefore, the height of solder joint is increased by the thickness of the insulating resin (about 0.2 mm). Thus, for solder connectivity, desirably, the diameter of the pad formed right above the core metal is not greater than the diameter of the BGA pad for electrical connection. Furthermore, for the pad pitch, preferably, the pitch of the solder joint pads for heat dissipation is smaller in order to enhance the heat dissipation property. Generally, the pad pitch is often formed in consideration of a safety factor to some extent for preventing short circuits. However, the heat dissipation solder parts raise no problem even though a short circuit is generated, and thus the pitch can be considerably decreased. This increases the total area of the connecting parts, and the heat dissipation property can be enhanced. Moreover, a solder resist was formed by pattern while the parts required for mounting components were left (FIGS. 11-(d) to (e)).

Here, two layers of the wiring layers are provided on the front and back sides of the metal core base material 20B for each side, but the invention does not depend on the number of the wiring layers. Thus, the wiring layers on the front and back sides of the metal core base material 20B are not necessarily two layers. In order to increase the number of the wiring layers on the front and back sides of the metal core base material 20B, it is fine to repeat the process steps from FIGS. 11(b) to (c).

Figure 12:
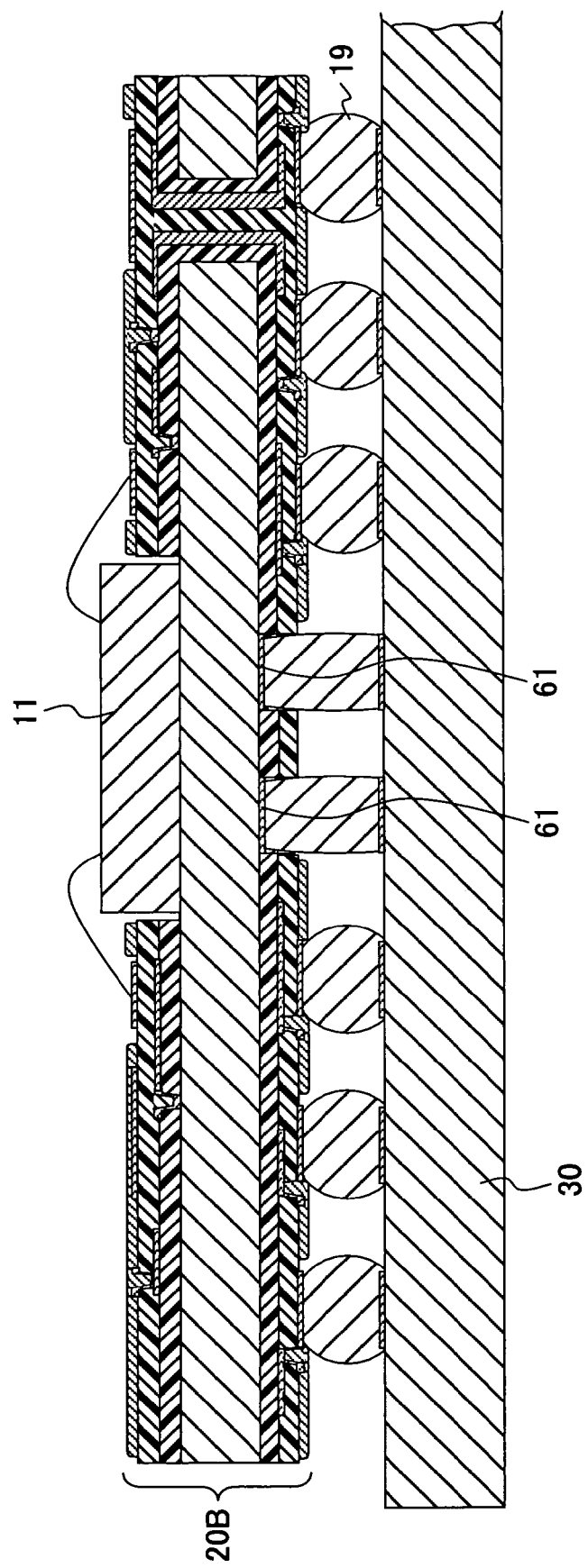
FIG. 12 is a cross-sectional view illustrating a mounting structure according to the invention.

FIG. 12 is an example of the structure that the substrate 20B thus fabricated is connected as the interposer substrate 20 to the motherboard 30. An LSI 11 of high heat dissipation is connected to the exposed part of the core metal of the metal core base material 20B with Ag paste of high thermal conductivity. When this connection is done by solder, the heat dissipation property can be more enhanced. An Sn3Ag 0.5 Cu solder ball of a diameter of 0.75 mmφ is mounted on the pad on the back side of the interposer substrate 20B, and solder is reflowed at a temperature of 240° C. exceeding the solder melting point. Therefore, a solder bump is formed. The solder bump is aligned with the pad on the motherboard, and the metal core base material 20B is mounted on the motherboard 30. After that, the solder was reflowed at a temperature of 240° C. for connection. When this structure is formed, the heat generated by the LSI can be effectively released to the motherboard.

Figure 13:
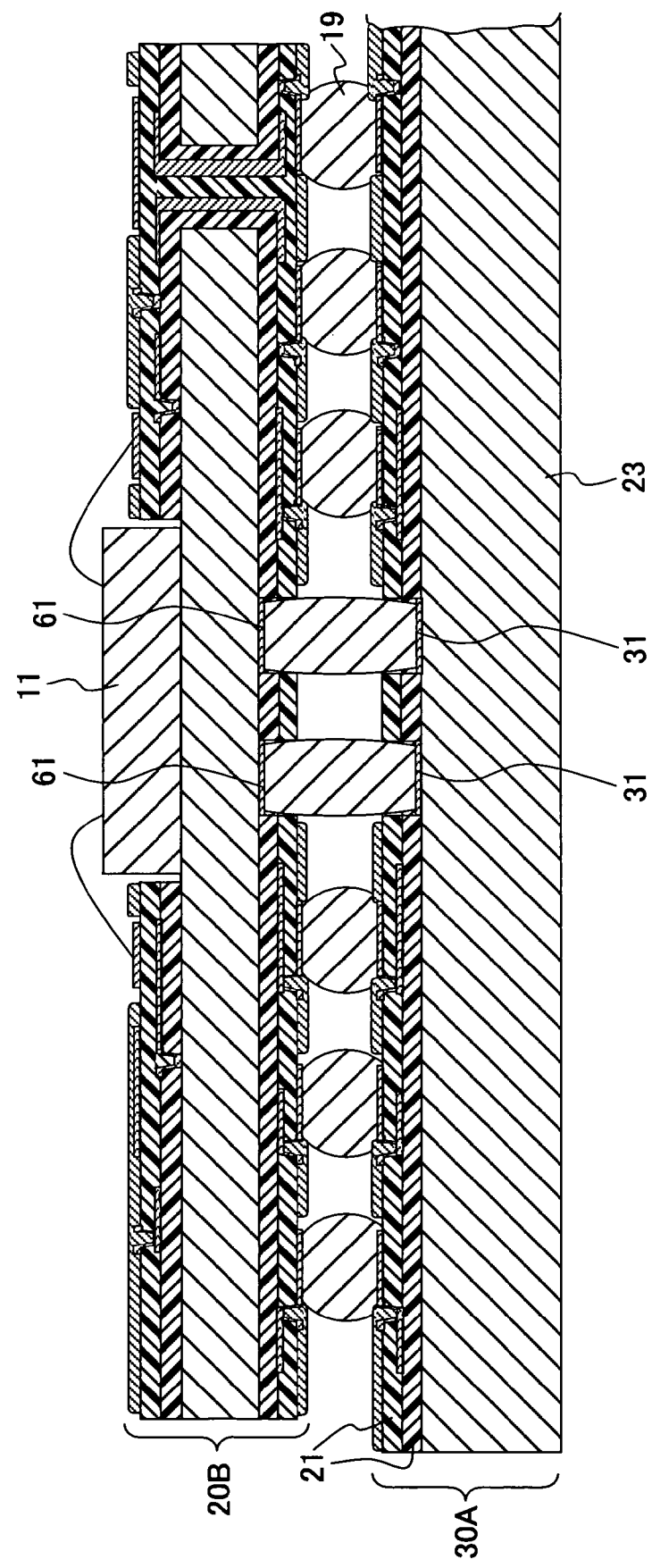
FIG. 13 is a cross-sectional view illustrating a mounting structure according to the invention.

FIG. 13 depicts the structure that a wiring board (metal base material) 30A with wiring on one surface having a metal plate as a base is used as the motherboard 30 shown in FIG. 12. As similar to the high heat dissipation substrate described above, a counterbore of an insulating resin and a pad 61 on the metal base exposed from the bottom part of the counterbore are formed in the metal core base material 20B, and the pad 61 is solder-joined to a pad 31 of the metal base material 30A. In this structure, since the heat generated by the LSI can be dissipated to the metal base of the motherboard, a more excellent heat dissipation property can be obtained.

Figure 14:
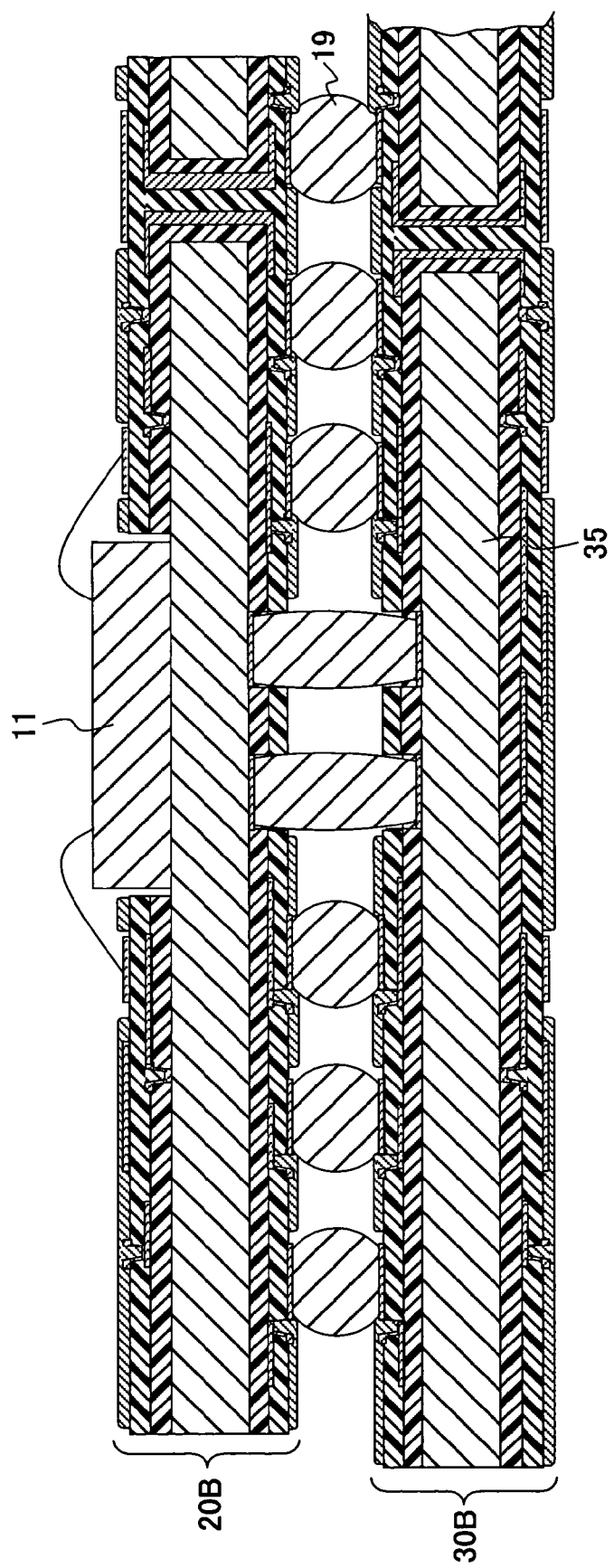
FIG. 14 is a cross-sectional view illustrating a mounting structure according to the invention.

FIG. 14 depicts the structure of using a metal core base material 30B with wiring on both surfaces as the motherboard 30 shown in FIG. 12. This structure is the same as the embodiment described in FIG. 13 except that the metal core base material 30B with wiring on both surfaces is used as the motherboard.

FIGS. 13 and 14 show the structures of the metal base material 30A and the metal core base material 30B in which the solder joint pad is formed on the metal exposed from the resin layer, which are used as the motherboard 30 shown in FIG. 12, but the motherboard 30 shown in FIG. 12 is not necessarily the metal base material 30A and the metal core base material 30B like this. For example, it is fine that a metal base material or metal core base material having no solder joint pad directly formed on the metal is used as the motherboard 30 shown in FIG. 12 and the solder joint pad on the resin layer of the motherboard is connected to the pad 61 on the metal base exposed from the insulating layer on the back side of the metal core base material 20B with solder.

Figure 15:
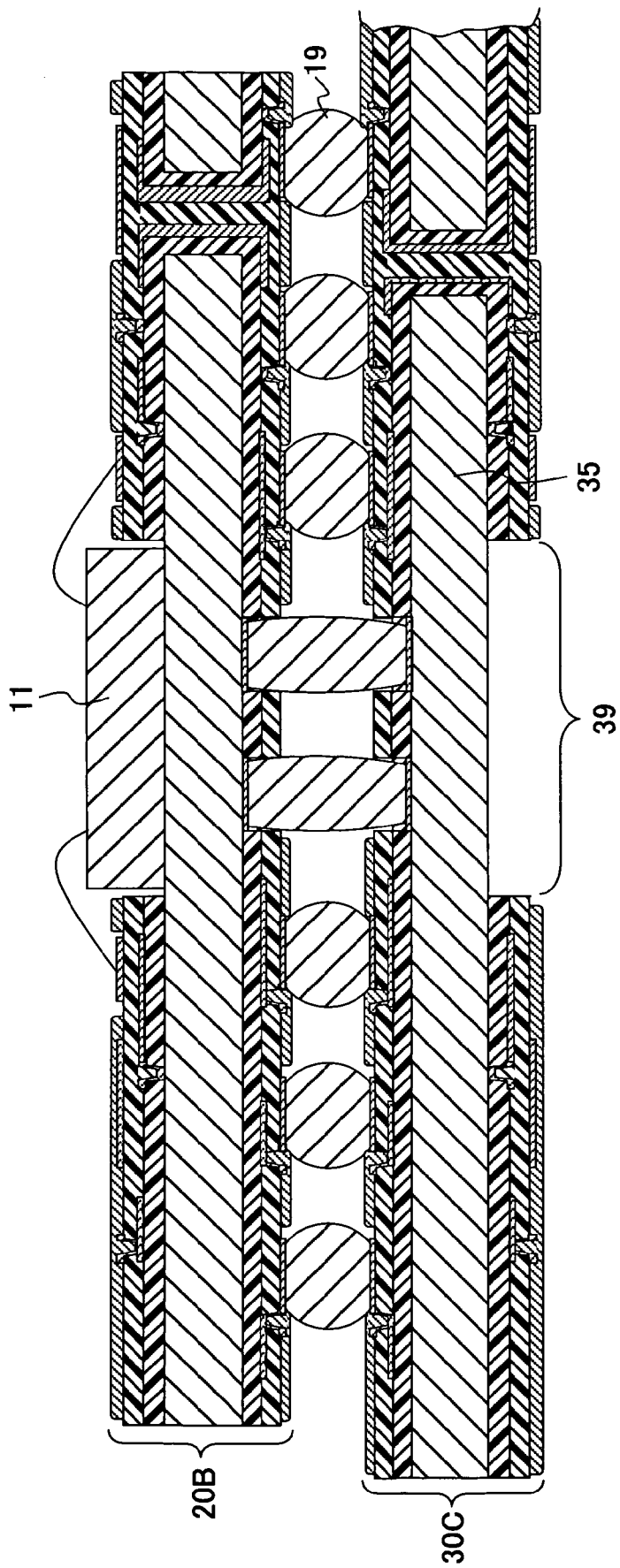
FIG. 15 is a cross-sectional view illustrating a mounting structure according to the invention.
Figure 16:
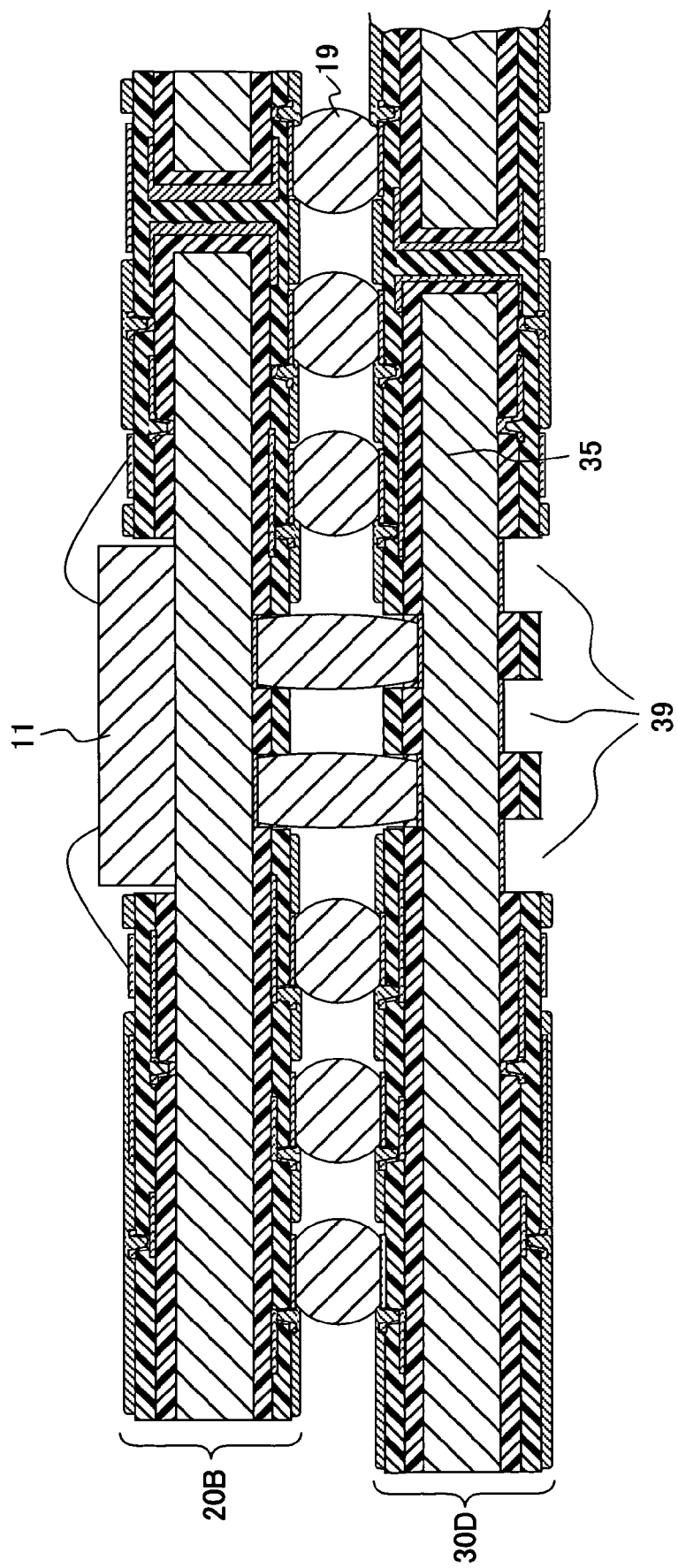
FIG. 16 is a cross-sectional view illustrating a mounting structure according to the invention.

As shown in FIGS. 15 and 16, when the core metal is partially exposed from the back side (the opposite side of the interposer mounting surface) of the motherboard, the heat dissipation property can be more enhanced. According to the structure, high heat dissipation properties can be obtained even in the structure that an underfill or gel is filled between the interposer and the motherboard, for example.

Figure 17:
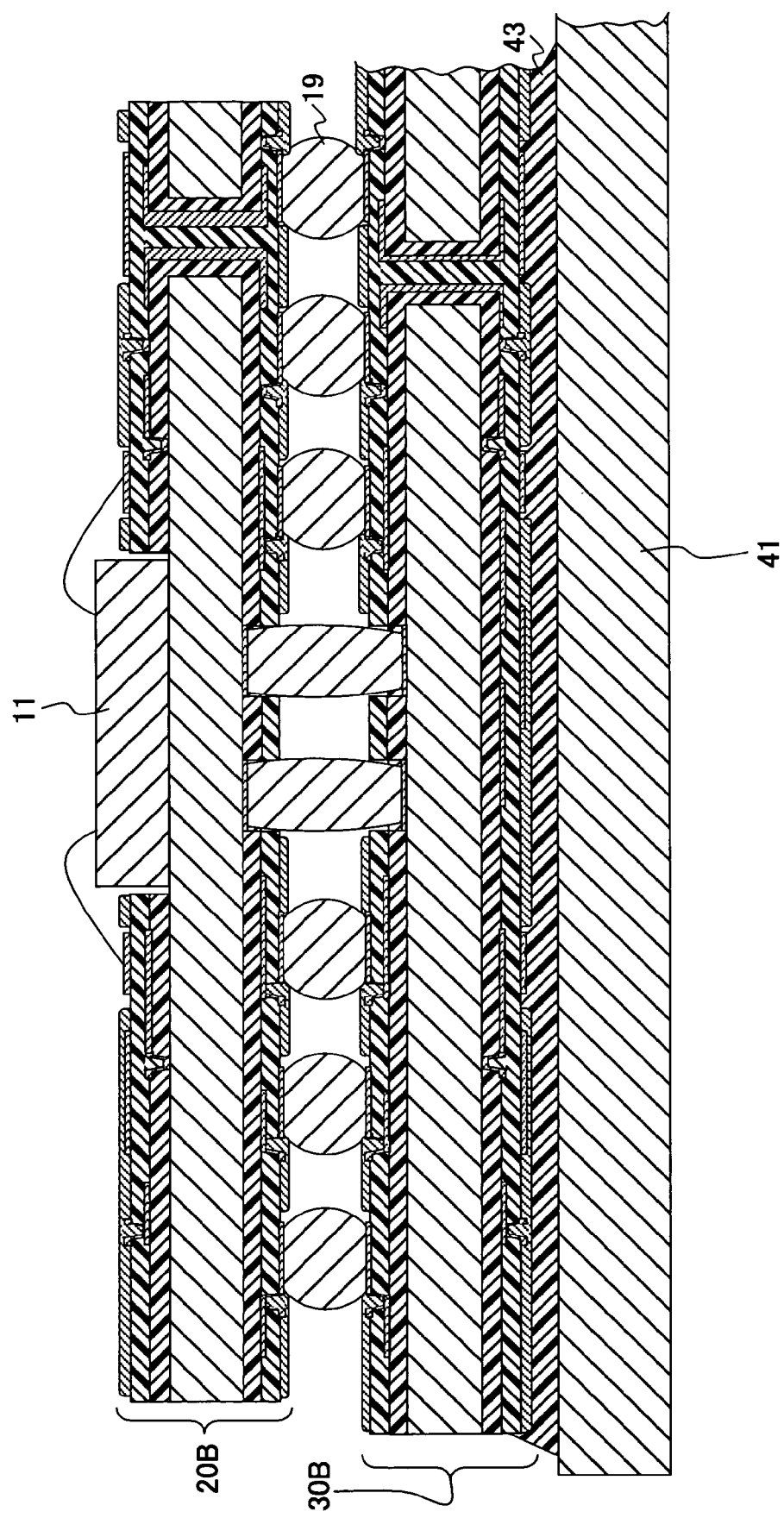
FIG. 17 is a cross-sectional view illustrating a mounting structure according to the invention.

FIG. 17 is an example of an ECU in which a metal core interposer substrate 20B mounted with an LSI 11 is solder-joined to the motherboard according to the invention and it is fixed to an aluminum case 41 with an adhesive 43.

Figure 18:
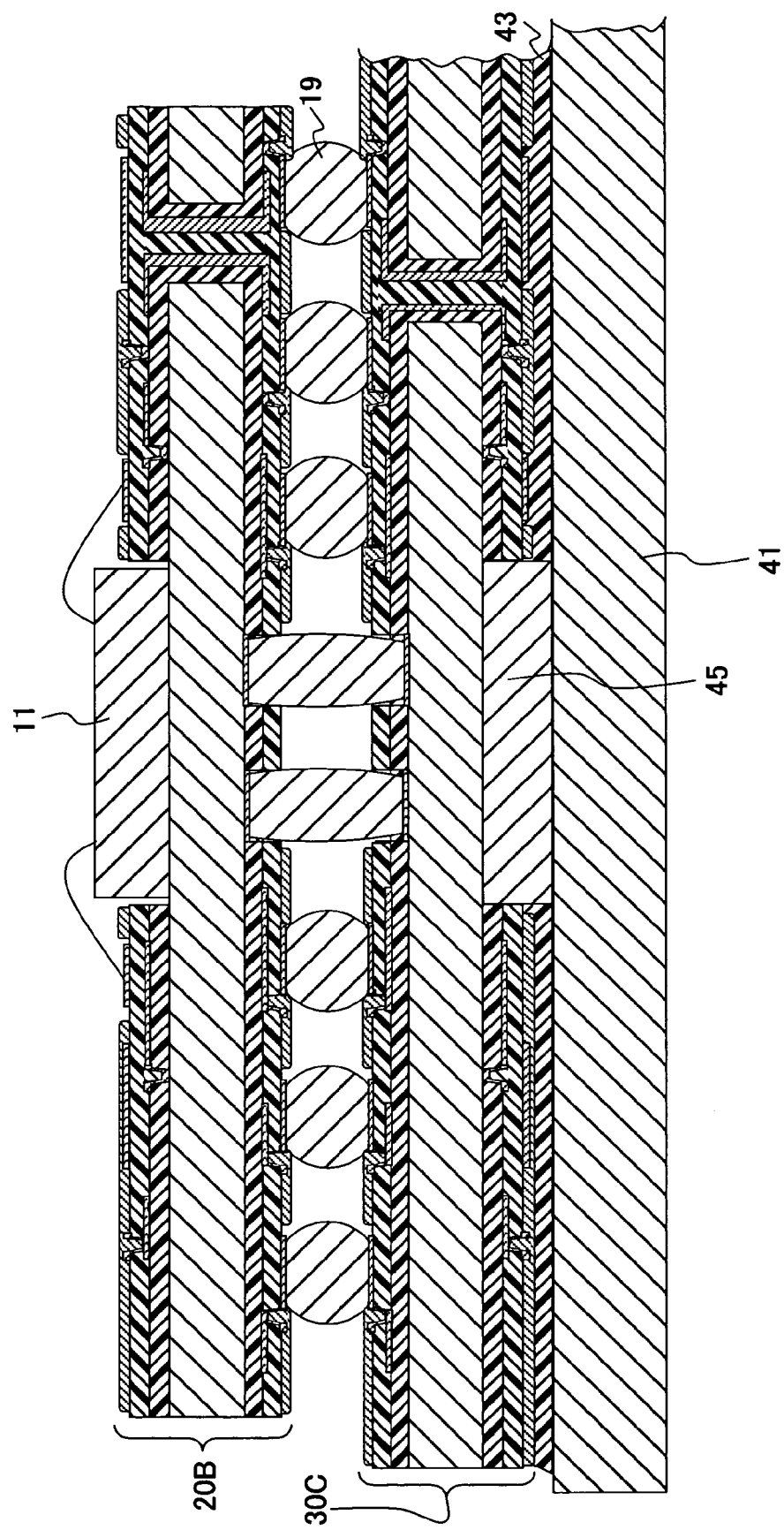
FIG. 18 is a cross-sectional view illustrating a mounting structure according to the invention.
Figure 19:
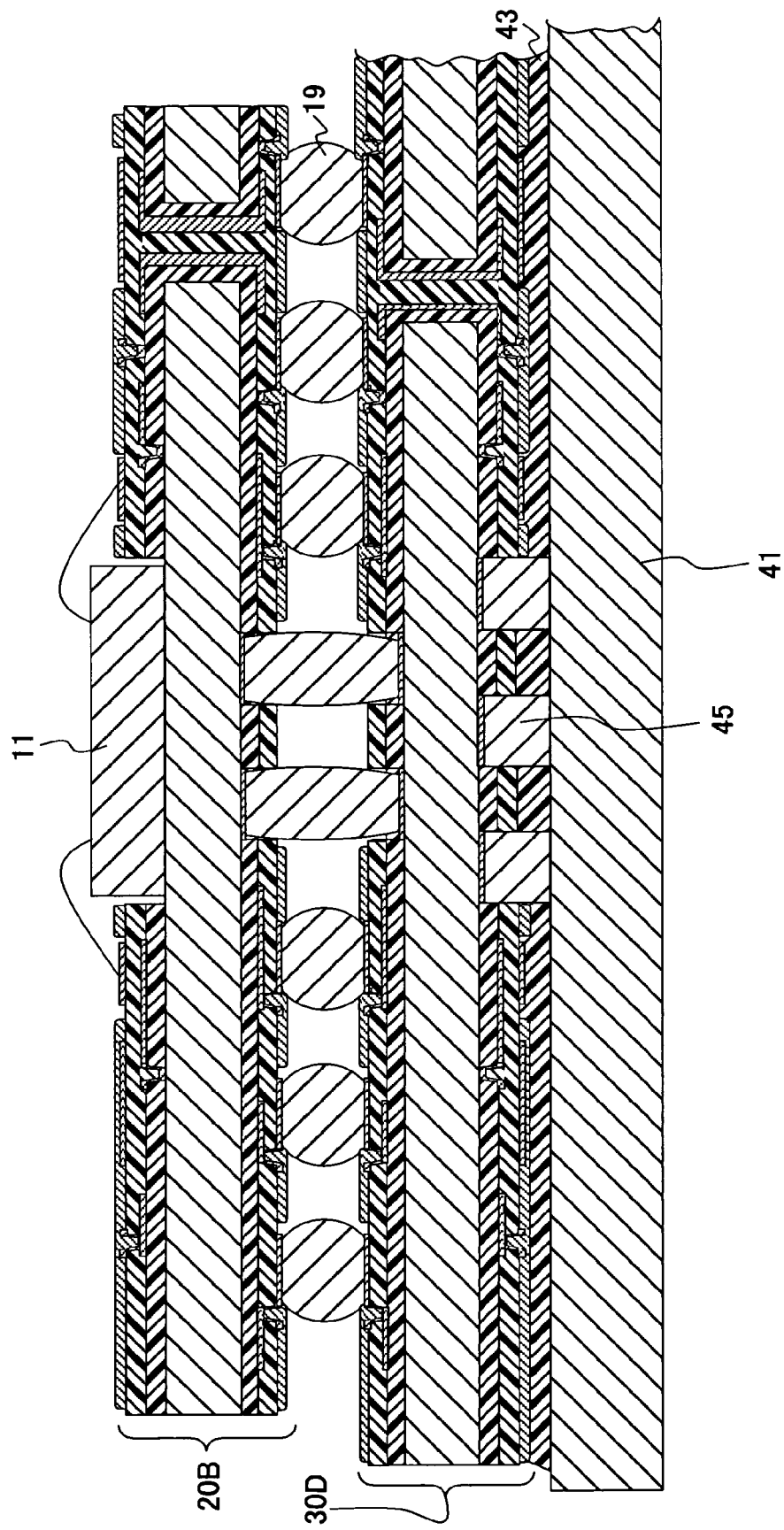
FIG. 19 is a cross-sectional view illustrating a mounting structure according to the invention.
Figure 20:
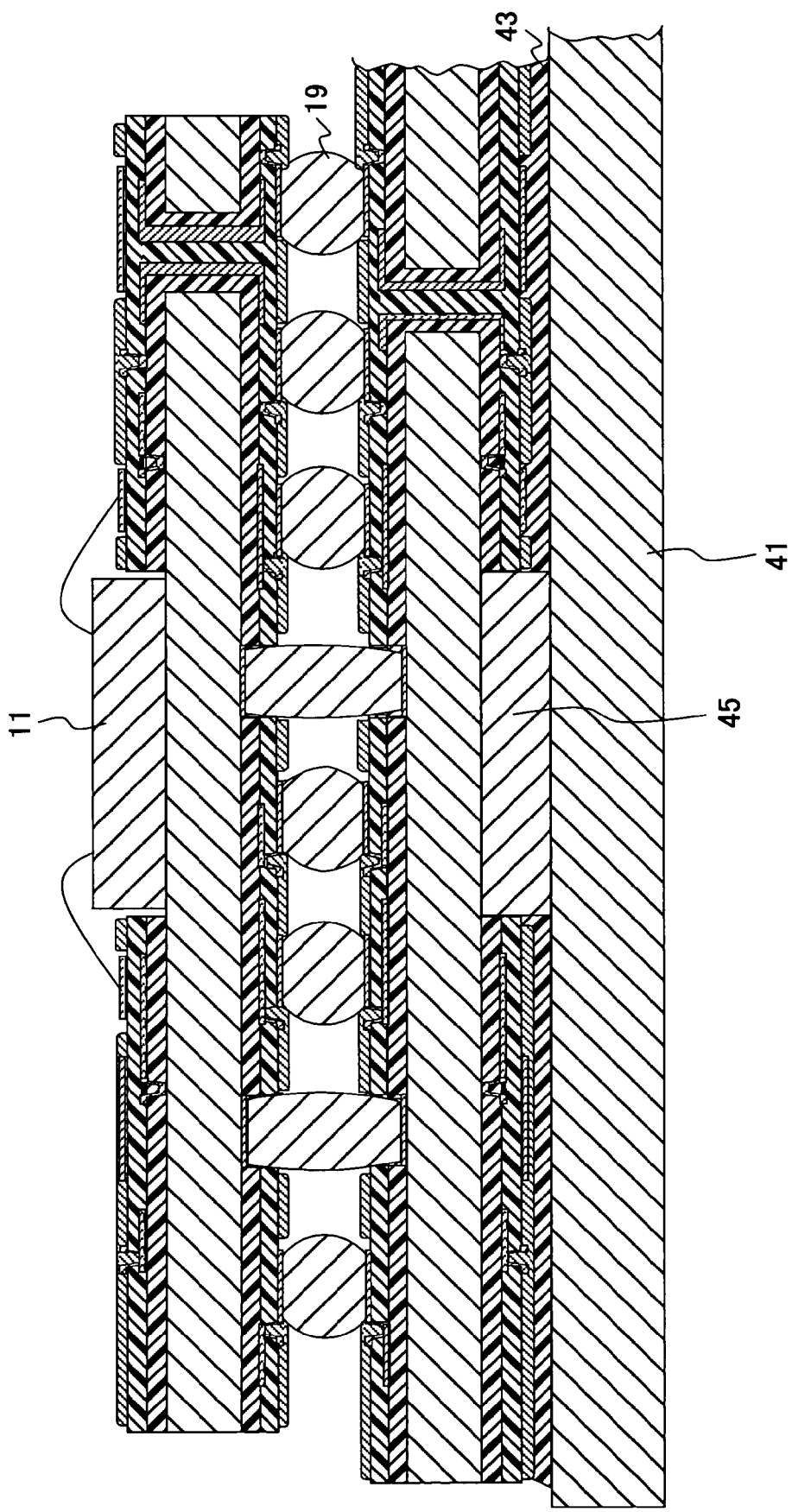
FIG. 20 is a cross-sectional view illustrating a mounting structure according to the invention.

As shown in FIGS. 18 and 19, when a highly thermal conductive member 45 is interposed between a counterbore part on the back side of the motherboard and a case 41, the heat dissipation property can be more enhanced. The highly thermal conductive member is a member that has thermal conductivity greater than that of an adhesive attaching the motherboard to the aluminum case, and is a metal plate such as copper and aluminum, solder, resin of high thermal conductivity or an adhesive, for example. When solder is used particularly, it is acceptable that a solder joint pad is formed on the case for connection, or solder is fed to the core metal of the motherboard and pressed to the case for connecting only by contact. When solder is just contacted to the case, a pad is not necessarily formed on the case. When the metal plate is sandwiched, it is acceptable that an adhesive is applied on both sides of the metal plate for connection, or the plate is simply contacted. Connecting the motherboard to the case except the relevant parts is effected by using an adhesive 43 such as a typical adhesive and a high thermal conductive adhesive. FIG. 20 is an example that a solder joint pad for heat dissipation is directly formed on a core metal and a solder joining part for heat dissipation is placed at the position out from right under a chip. Furthermore, it is fine that an electrical solder joining part is in the area right under the chip. As shown in the embodiment, regardless of the position of the chip on the substrate, the solder joining part for heat dissipation and the electrical connecting part can be arranged freely according to wiring design and heat dissipation design.

An exemplary fabrication process of implementing the structures shown in FIGS. 12 to 16 will be described below. First, since the fabrication method of the interposer substrate 20B has been shown in FIG. 11, it is omitted. Ag paste is applied to the counterbore part for mounting the high heat dissipation LSI and desired parts for mounting other components of the metal core base material 20B, and electronic components are mounted. Then, the Ag paste is cured and attached under suitable curing conditions (for example 150° C. for one hour). The electrode of the high heat dissipation LSI is wire-bonded to the electrode of the metal core interposer 20B. Handleability is enhanced when the surface of the metal core base material 20B for mounting components is molded by resin, as required. After flux is applied, a solder ball is mounted on the electrode on the back side (the opposite side of the surface for mounting components) of the interposer substrate. At this time, a solder ball is also mounted on the pad for heat dissipation right above the core metal. Sn3Ag 0.5 Cu solder is used for reflow at the maximum temperature of 240° C. for about 20 seconds of solder fusion time to form a solder bump. It is acceptable to use other solders, and a solder bump is formed under reflow conditions in accordance with the solder type. A solder printing mask having a mask thickness of 0.1 mm is used on the motherboard to print solder paste by printing. On the printed solder in paste, the interposer substrate formed with the solder bump is aligned and mounted. After that, the solder is again reflowed for solder joint. It is not necessary to perform solder printing, but when it is done, the viscosity of the printed solder can prevent misregistration of the interposer substrate.

As described in FIGS. 14 to 16, when the motherboard is the metal core base materials 30B, 30C and 30D having the insulating layer and the wiring layer on both sides of the core metal 35, the metal core base materials are fabricated by the method described in FIG. 11, and then joint is effected by the same method as described above. As described in FIG. 13, the case where the motherboard is the metal base material is the same.

Figure 22:
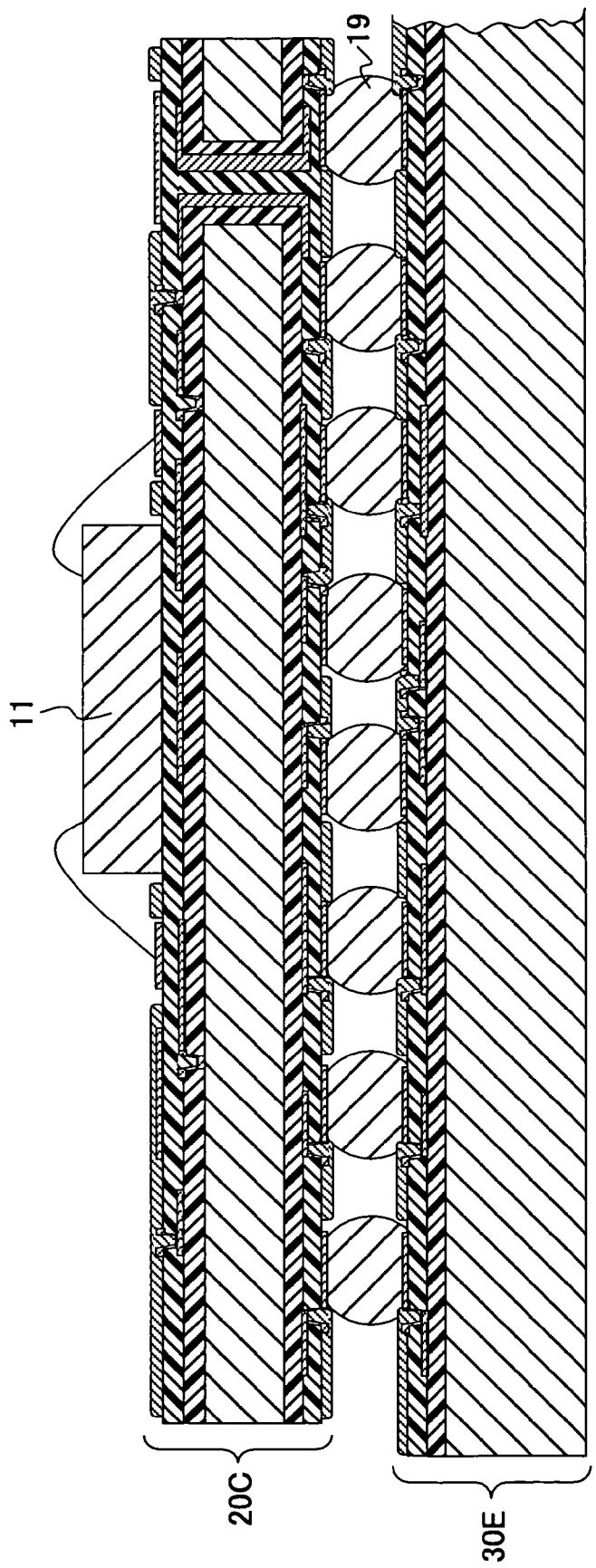
FIG. 22 is a cross-sectional view illustrating a mounting structure according to the invention.
Figure 24:
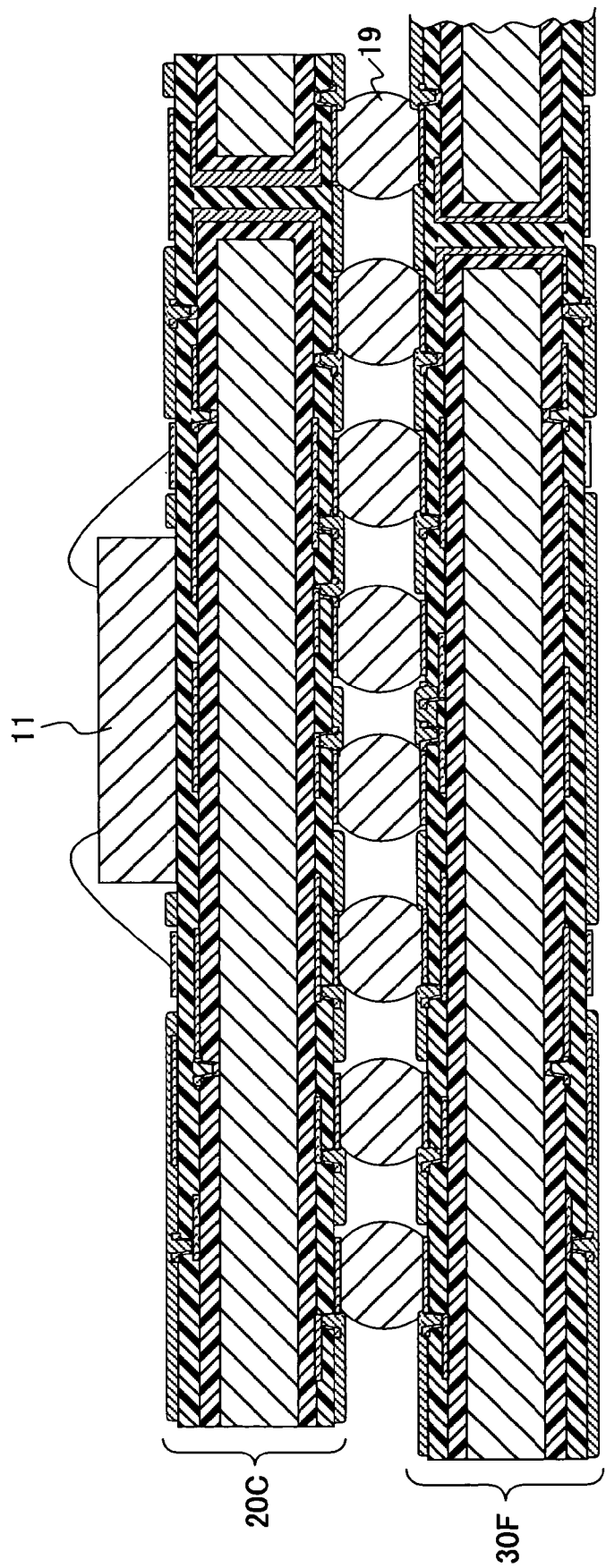
FIG. 24 is a cross-sectional view illustrating a mounting structure according to the invention.

In a module shown in FIG. 22, an LSI chip 11 of face-up type is die-bonded to the front surface of a metal core base material 20C, and a solder joint pad on an insulating layer on the back side of the metal core base material 20C is connected to a solder joint pad on an insulating layer of a metal base material 30E with solder. Here, the metal base material 30E is used as the motherboard 30, but it is fine to use a metal core base material 30F as the motherboard 30 as shown in FIG. 24.

Figure 23:
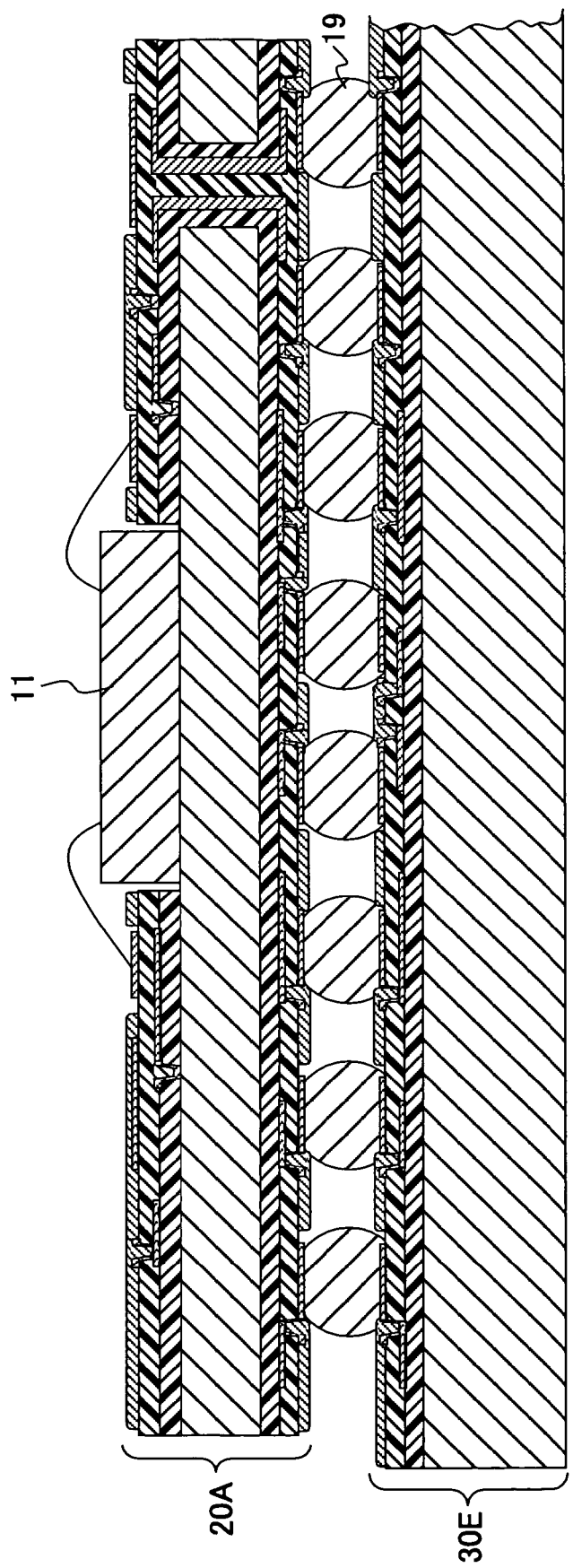
FIG. 23 is a cross-sectional view illustrating a mounting structure according to the invention.
Figure 25:
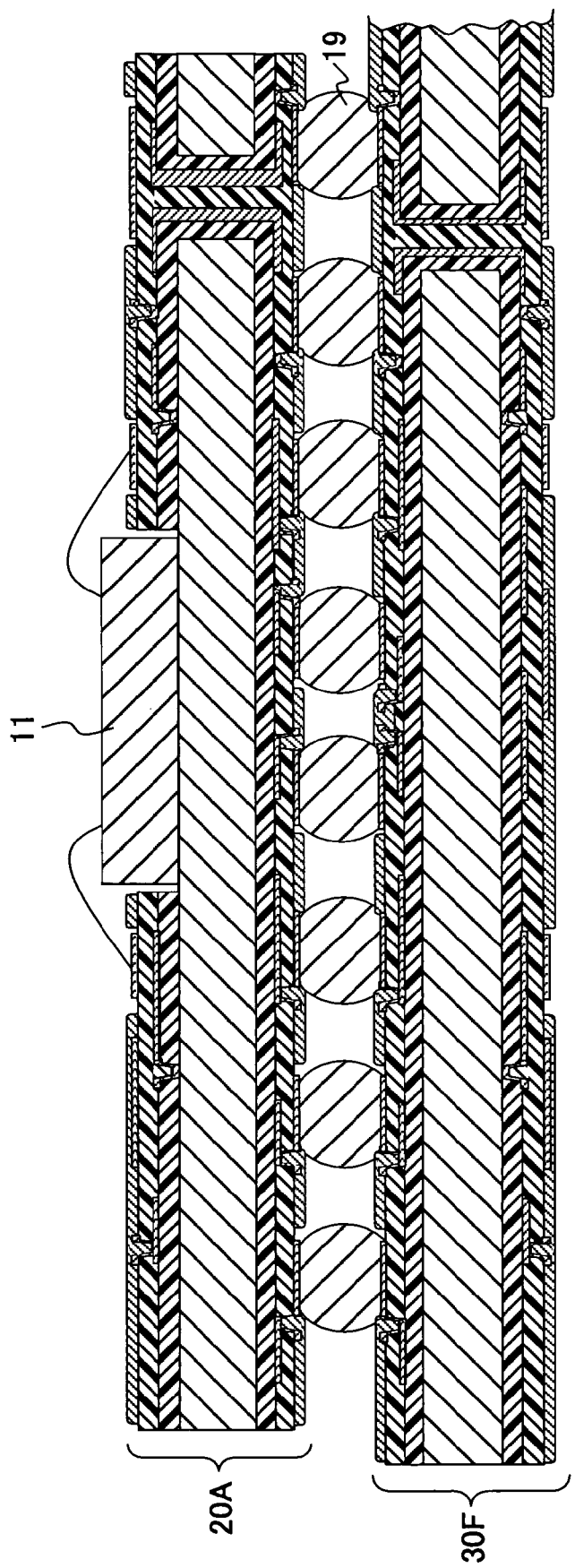
FIG. 25 is a cross-sectional view illustrating a mounting structure according to the invention.

A module shown in FIG. 23 has the same structure as that of the module shown in FIG. 22, except that an insulating resin is partially removed from an insulating layer 21 on the metal core interposer substrate 20A and an LSI chip 11 is mounted on the core metal in that area without intervening the insulating layer 21. Here, the metal base material 30E is used as the motherboard 30, but it is acceptable that a metal core base material 30F is used as the motherboard 30, as shown in FIG. 25.

Figure 6:
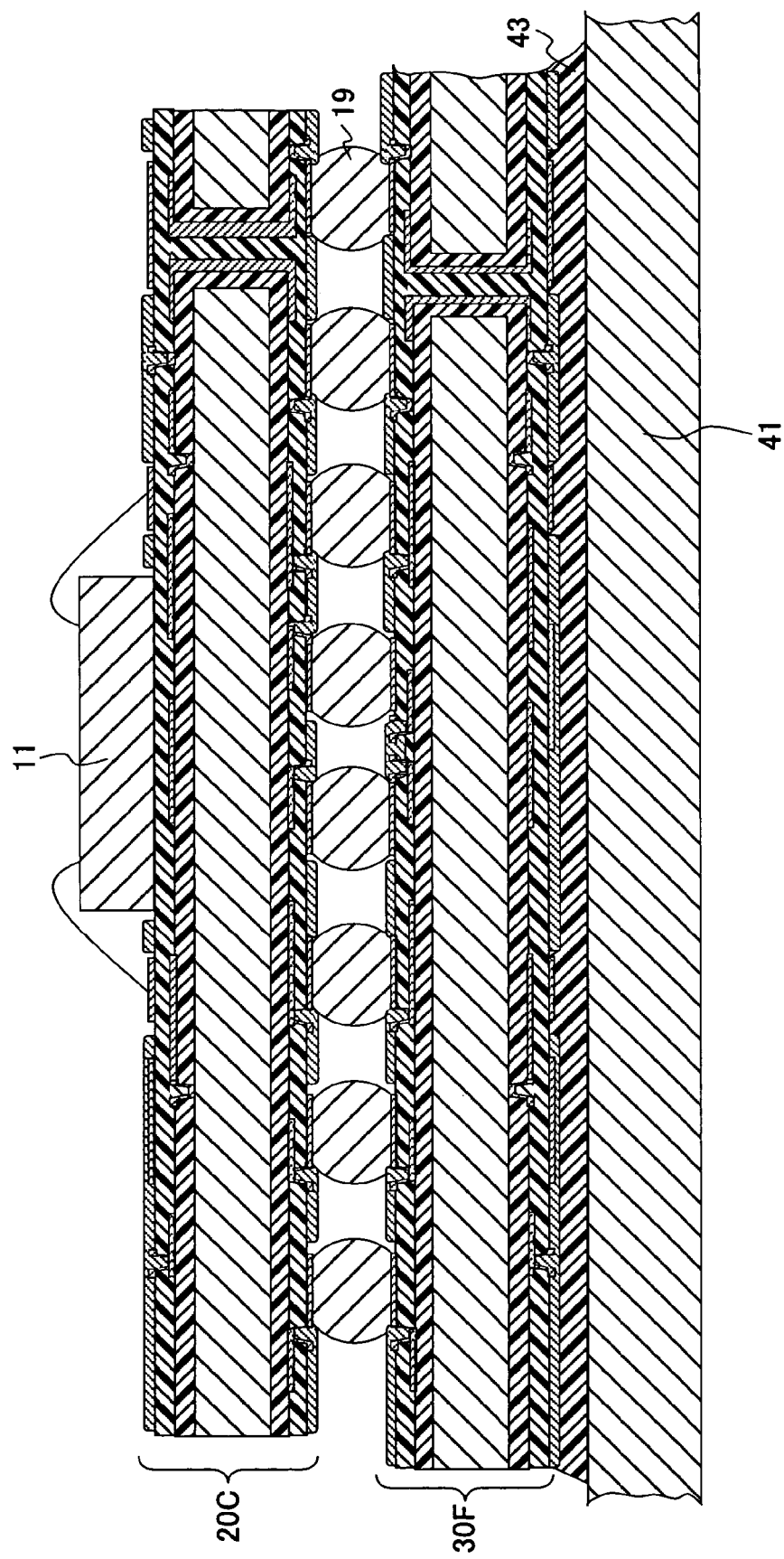
FIG. 6 is a cross-sectional view illustrating a mounting structure according to the invention.

In addition, the modules shown in FIGS. 22 to 25 can be attached to the lower case 41 by the same methods as done to the modules shown in FIGS. 1 and 2. When an example is taken, as shown in FIG. 6, in the module shown in FIG. 24, the back side of the metal core base material 30F (the motherboard) is attached to the lower case 41 with an adhesive 43.

As described above, according to the invention, the electronic device excellent in the heat dissipation property can be provided at low cost as the reliability of joint is maintained between the interposer substrate and the motherboard.

INDUSTRIAL APPLICABILITY

The electronic device excellent in the heat dissipation property can be provided at low cost as the reliability of joint is maintained between the interposer substrate and the motherboard.

The invention claimed is:

1. An electronic device comprising:
an interposer substrate having a core metal, a wiring layer and an insulating layer formed on each side of the core metal, and having one side of the core metal as a first side in which a semiconductor chip is mounted and the other side of the core metal as a second side, and
a motherboard having a metal plate, a wiring layer and an insulating layer formed on at least one side of the metal plate, and having the interposer substrate which is mounted on the one side of the metal plate,
wherein:
an area where the one side of the metal plate is exposed by partially removing the insulating layer formed on the motherboard;
a part of a solder joint pad formed on the insulating layer on the second side of the interposer substrate is joined to a pad formed on an exposed area on the one side of the metal plate of the motherboard with a first solder bump, and
a part of a solder joint pad on the second side of the interposer substrate is joined to a pad formed on the insulating layer on the one side of the metal plate of the motherboard with a second solder bump.

2. The electronic device according to claim 1, wherein:
an area where the side of the core metal is exposed by partially removing the insulating layer is formed on the first side of the interposer substrate; and the semiconductor chip is die-bonded to the area where the core metal is exposed on the first side of the interposer substrate.

3. The electronic device according to claim 1, wherein:
an area where the side of the core metal is exposed is formed on the first side of the interposer substrate; and the semiconductor chip is die-bonded to the area where the core metal is exposed.

4. The electronic device according to claim 1, wherein:
the part of the solder joint pad formed on the second side of the interposer substrate is opposite the semiconductor chip mounted on the first side of the interposer substrate.

5. The electronic device according to claim 1, wherein:
the side of a pad formed on the area where the side of the metal plate is exposed on the motherboard is smaller than that the size of a pad formed on the insulating layer.

6. The electronic device according to claim 1, wherein:
the first solder bump is taller than the second solder bump.

7. An electronic device comprising:
an interposer substrate having a core metal, a wiring layer and an insulating layer formed on each side of the core metal, and having one side of the core metal as a first side in which the LSI is mounted and the other side of the core metal as a second side; and
a motherboard having a metal plate, a wiring layer and an insulating layer formed on at least the one side of the metal plate, and having the interposer substrate which is mounted on one side of the metal plate,
wherein:
an area where the core metal is exposed by partially removing the insulating layer is formed on the first side of the interposer substrate;

the LSI is connected to the area where the core metal is exposed on the first side of the interposer substrate and wire-bonded to an electrode of the interposer substrate;

an area where a pad for heat dissipation is formed on the insulating layer on the second side of the interposer substrate;

an area where the side of the metal plate is exposed by partially removing the insulating layer is formed on the motherboard, and having a pad for heat dissipation on the area where the side of the metal plate is exposed; and the pad for heat dissipation on the interposer substrate is joined to the pad for heat dissipation on the motherboard with solder.

8. The electronic device according to the claim 7, wherein:

the interposer substrate has a pad for signal which is formed on the wring layer of the interposer substrate, the motherboard has a pad for signal which is formed on the wring layer of the motherboard, and the pad for heat dissipation of the substrate and the pad for heat dissipation of the motherboard is smaller than the pad for signal of the interposer substrate and the pad for signal of the motherboard.

9. The electronic device according to the claim 8, characterized in that:

solder bumps formed by melting solder balls of the same size is jointed the pads for signal between the interposer substrate and the motherboard and the pads for heat dissipation of the interposer base substrate and the motherboard.

* * * * *